US012598857B2

(12) United States Patent
Isono et al.

(10) Patent No.: US 12,598,857 B2
(45) Date of Patent: Apr. 7, 2026

(54) IMAGING DEVICE INCLUDING AN ELECTRODE HAVING A TANTALUM NITRIDE LAYER AND ANOTHER LAYER

(71) Applicant: Panasonic Intellectual Property Management Co., Ltd., Osaka (JP)

(72) Inventors: Shunsuke Isono, Osaka (JP); Yuuko Tomekawa, Osaka (JP); Ryota Sakaida, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 475 days.

(21) Appl. No.: 18/183,049

(22) Filed: Mar. 13, 2023

(65) Prior Publication Data

US 2023/0232644 A1     Jul. 20, 2023

Related U.S. Application Data

(63) Continuation of application No. PCT/JP2021/034222, filed on Sep. 17, 2021.

(30) Foreign Application Priority Data

Sep. 24, 2020   (JP) ................................. 2020-159866

(51) Int. Cl.
| | |
|---|---|
| *H10K 39/32* | (2023.01) |
| *H01L 21/28* | (2025.01) |
| *H01L 23/532* | (2006.01) |
| *H04N 25/70* | (2023.01) |

(52) U.S. Cl.
CPC .................................. *H10K 39/32* (2023.02)

(58) Field of Classification Search
CPC ..... H10K 39/32; H01L 21/28; H01L 21/3205; H01L 21/768; H01L 23/532; H04N 25/70; H10F 39/192; H10F 39/8033; H10F 39/811
See application file for complete search history.

(56) References Cited

U.S. PATENT DOCUMENTS

| | | | |
|---|---|---|---|
| 2008/0078923 A1 | 4/2008 | Hirose | |
| 2018/0315786 A1* | 11/2018 | Hirase ................... | H10F 39/803 |
| 2019/0252488 A1* | 8/2019 | Koyanagi ......... | H01L 21/02181 |
| 2021/0066360 A1 | 3/2021 | Tomekawa et al. | |

FOREIGN PATENT DOCUMENTS

| | | |
|---|---|---|
| JP | 03-171769 | 7/1991 |
| JP | 07-066380 | 3/1995 |
| JP | 2008-109110 | 5/2008 |
| WO | 2019/239851 | 12/2019 |

OTHER PUBLICATIONS

International Search Report of PCT application No. PCT/JP2021/034222 dated Dec. 7, 2021.

* cited by examiner

*Primary Examiner* — Ahmed A Berhan
(74) *Attorney, Agent, or Firm* — Rimon P.C.

(57) ABSTRACT

An imaging device includes a photoelectric conversion film and an electrode. The photoelectric conversion film converts light to charge. The electrode collects the charge. The electrode includes two or more layers. The two or more layers include a first layer containing tantalum nitride. An uppermost layer among the two or more layers contains a metal nitride.

18 Claims, 19 Drawing Sheets

FIG. 6D
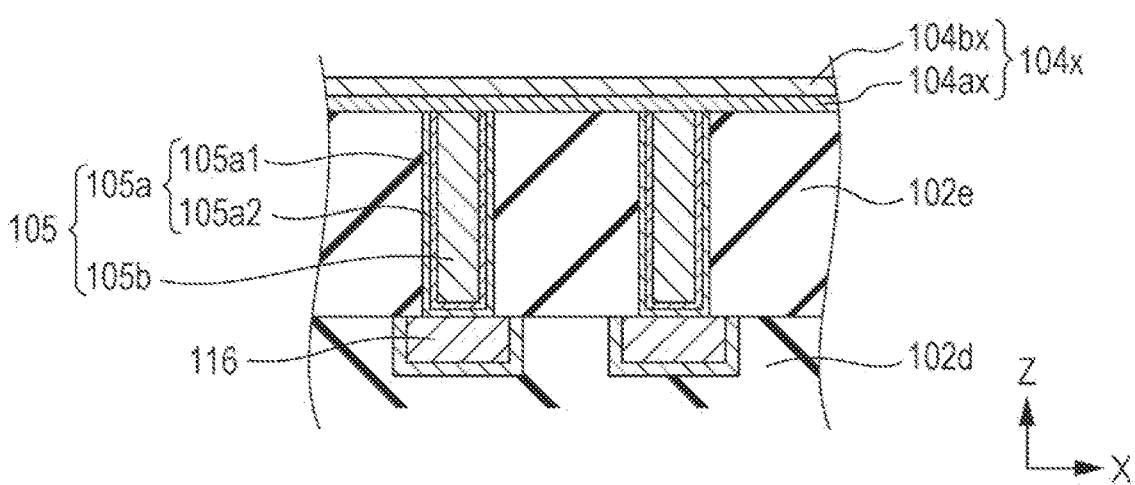
FIG. 6E
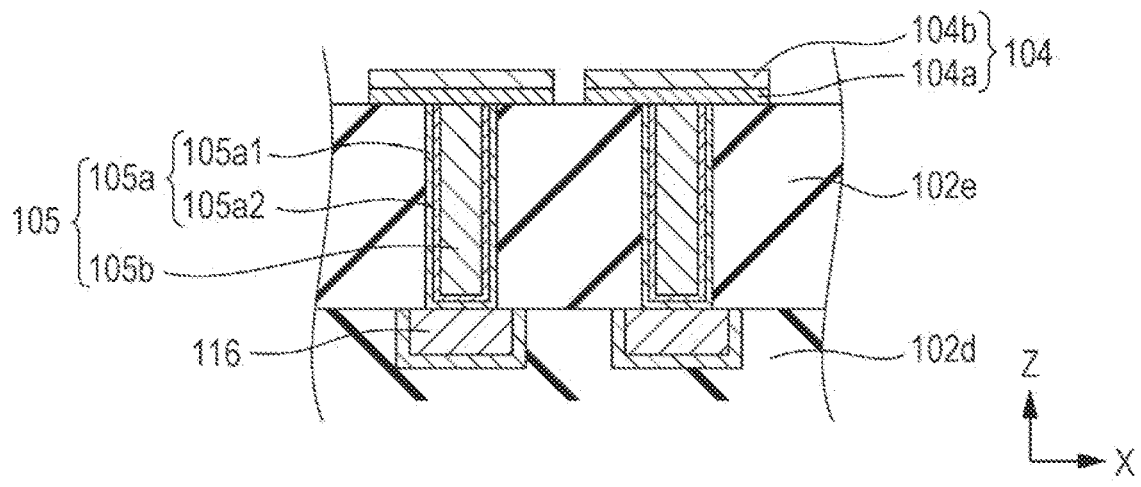
FIG. 6F

IMAGING DEVICE INCLUDING AN ELECTRODE HAVING A TANTALUM NITRIDE LAYER AND ANOTHER LAYER

BACKGROUND

1. Technical Field

The present disclosure relates to an imaging device.

2. Description of the Related Art

Stacked imaging devices are known. The stacked imaging devices have a stacked structure including a semiconductor substrate and a photoelectric conversion film. An example of such stacked imaging devices is described in Japanese Unexamined Patent Application Publication No. 3-171769. An electrode of the imaging device of Japanese Unexamined Patent Application Publication No. 3-171769 has a TiN/Ti structure, that is, a structure in which a titanium nitride layer is disposed on a titanium layer.

SUMMARY

In one general aspect, the techniques disclosed here feature an imaging device including a photoelectric conversion film that converts light to charge, and an electrode that collects the charge. The electrode includes two or more layers. The two or more layers include a first layer containing tantalum nitride. An uppermost layer among the two or more layers contains a metal nitride.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 6D is a schematic process view illustrating part of the process of manufacturing the imaging device;

FIG. 6E is a schematic process view illustrating part of the process of manufacturing the imaging device;

FIG. 6F is a schematic process view illustrating part of the process of manufacturing the imaging device;

DETAILED DESCRIPTIONS

Figure 1:
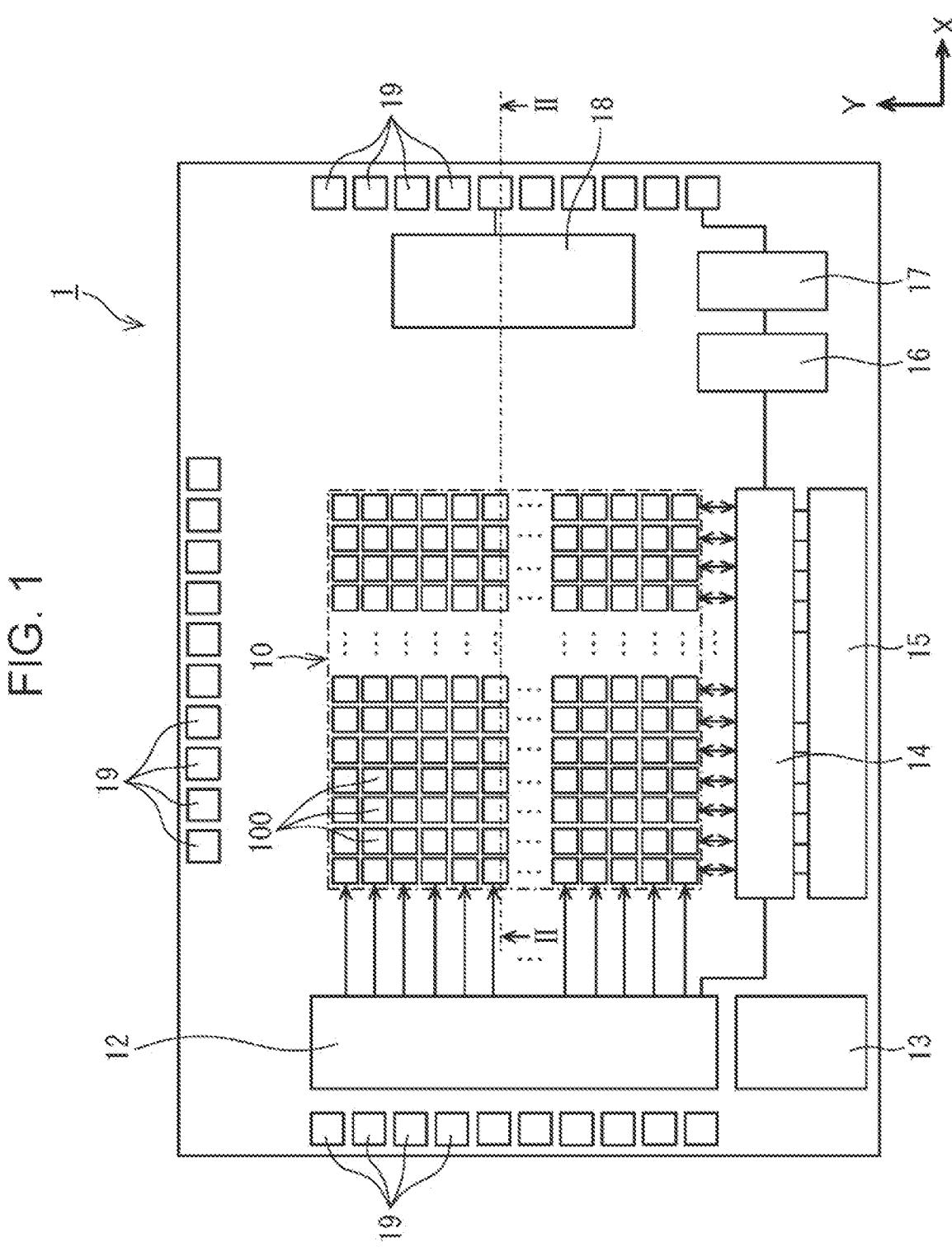
FIG. 1 is a schematic plan view illustrating a configuration of an imaging device.

Underlying Knowledge Forming Basis of Present Disclosure

The electrode of the imaging device of Japanese Unexamined Patent Application Publication No. 3-171769 has the TiN/Ti structure. In this electrode, a metal derived from outside the electrode can be diffused. Such diffusion leads to various disadvantages in the process of manufacturing an imaging device, for example.

For example, when the top surface of the electrode is exposed to oxygen in the state where a metal has been diffused into the top surface of the electrode in the manufacturing process, the metal can be abnormally oxidized to form lumps of a metal oxide on the top surface of the electrode. In the case where a photoelectric conversion film is provided on this electrode, metal atoms in the above-described lumps can be diffused into the photoelectric conversion film and deteriorate the leakage characteristics of the photoelectric conversion film. In addition, in the case where a wire or another electrode is to be connected to the top surface of this electrode, the above-described lumps can pose problems to these connections.

Summary of Aspect According to Present Disclosure

An imaging device according to a first aspect of the present disclosure includes:

a photoelectric conversion film that converts light to charge; and an electrode that collects the charge. The electrode includes two or more layers.

The two or more layers include a first layer containing tantalum nitride. An uppermost layer among the two or more layers contains a metal nitride.

In the electrode according to the first aspect, it is possible to suppress diffusion of a metal derived from outside the electrode.

In a second aspect of the present disclosure, for example, in the imaging device according to the first aspect, the uppermost layer may be a second layer different from the first layer.

According to the second aspect, it is easy to have advantages derived from the metal nitride while suppressing disadvantages derived from tantalum nitride.

In a third aspect of the present disclosure, for example, in the imaging device according to the second aspect, the second layer may contain titanium nitride.

According to the third aspect, it is possible to achieve an electrode that takes advantage of the properties of titanium nitride.

In a fourth aspect of the present disclosure, for example, in the imaging device according to the second aspect or the third aspect, the first layer may be thinner than the second layer.

According to the fourth aspect, it is easy to have the advantages derived from the metal nitride while suppressing the disadvantage derived from tantalum nitride.

In a fifth aspect of the present disclosure, for example, in the imaging device according to the first aspect, the uppermost layer may be the first layer.

In the uppermost layer according to the fifth aspect, it is possible to suppress diffusion of a metal derived from outside the electrode.

In a sixth aspect of the present disclosure, for example, in the imaging device according to any one of the first to fifth aspects, a lowermost layer among the two or more layers may contain tantalum.

According to the sixth aspect, it is easy to join the electrode to a structure containing a material having a high joinability with tantalum.

An imaging device according to a seventh aspect of the present disclosure includes:

a photoelectric conversion film that converts light to charge; and an electrode that collects the charge. The electrode includes an electrode body and an insulating film. The electrode body includes at least part of a top surface of the electrode and at least part of a bottom surface of the electrode.

In the electrode according to the seventh aspect, it is possible to suppress diffusion of a metal derived from outside the electrode.

In an eighth aspect of the present disclosure, for example, in the imaging device according to the seventh aspect, in a cross-section perpendicular to a thickness direction of the insulating film, the insulating film may be surrounded by the electrode body.

In the electrode according to the eighth aspect, it is possible to achieve suppression of diffusion of a metal derived from outside the electrode while suppressing an increase in resistance value of the electrode.

In a ninth aspect of the present disclosure, for example, the imaging device according to the seventh aspect or the eighth aspect may further include:

a plug that has a connection surface connected to the electrode and that contains a metal.

According to the ninth aspect, it is possible to extract charge from the electrode through the plug while suppressing diffusion of the metal derived from the plug in the electrode.

In a tenth aspect of the present disclosure, for example, in the imaging device according to the ninth aspect, the electrode body may include a first layer disposed between the plug and the insulating film, the insulating film may contain an oxide, and the first layer may contain a non-oxide.

According to the tenth aspect, the metal in the plug is less likely to react with the oxide derived from the insulating film.

In an eleventh aspect of the present disclosure, for example, in the imaging device according to the ninth aspect or the tenth aspect, when viewed from above, at least part of the insulating film and at least part of the connection surface in the plug may overlap each other.

According to the eleventh aspect, it is easy to suppress diffusion of the metal derived from the plug in the electrode.

In a twelfth aspect of the present disclosure, for example, in the imaging device according to the eleventh aspect, when viewed from above, an entirety of the connection surface may overlap the insulating film.

According to the twelfth aspect, it is easy to suppress diffusion of the metal derived from the plug in the electrode.

In a thirteenth aspect of the present disclosure, for example, in the imaging device according to any one of the ninth to twelfth aspects, the plug may contain copper.

In the electrode according to the thirteenth aspect, it is possible to suppress diffusion of copper derived from the plug.

In a fourteenth aspect of the present disclosure, for example, in the imaging device according to any one of the seventh to thirteenth aspects, the electrode body may include a second layer that includes an entirety of the top surface of the electrode.

According to the fourteenth aspect, it is possible to impart desired properties to the top surface of the electrode by using the second layer.

In a fifteenth aspect of the present disclosure, for example, in the imaging device according to any one of the seventh to ninth aspects, the electrode body may include a first layer and a second layer, the insulating film may be located between the first layer and the second layer.

The configuration of the fifteenth aspect is a specific example of the configuration that the electrode may have.

In a sixteenth aspect of the present disclosure, for example, in the imaging device according to any one of the seventh to fifteenth aspects, a thickness of the insulating film may be greater than or equal to 10 nm.

According to the sixteenth aspect, it is easy to ensure the above-described diffusion suppressing action.

In a seventeenth aspect of the present disclosure, for example, in the imaging device according to any one of the first to sixteenth aspects, an angle formed by a side surface of the photoelectric conversion film and a bottom surface of the photoelectric conversion film in a cross-section parallel to a thickness direction of the photoelectric conversion film may be greater than or equal to 70° and less than or equal to 90°, and in the cross-section, at least part of the electrode may be located outside the photoelectric conversion film in a lateral direction with respect to the side surface.

The shape of the photoelectric conversion film of the seventeenth aspect can be obtained by dry etching using oxygen. Oxygen can oxidize a metal. However, the electrode of the seventeenth aspect makes it possible to suppress diffusion of a metal derived from outside the electrode. Accordingly, even when the top surface of the electrode is exposed to oxygen in a state where the bottom surface of the electrode is in contact with a structure containing a metal, it is possible to suppress a situation where the metal is abnormally oxidized.

In an eighteenth aspect of the present disclosure, for example, in the imaging device according to any one of the first to sixth aspects, parts of outer peripheral ends of the two or more layers may coincide with each other.

In a nineteenth aspect of the present disclosure, for example, in the imaging device according to any one of the first to sixth aspects, outer peripheral ends of the two or more layers may coincide with each other.

In a twentieth aspect of the present disclosure, for example, the imaging device according to any one of first to sixth aspects may further include:

a plug that has a connection surface connected to the electrode and that contains a metal.

A method for manufacturing an imaging device according to a twenty-first aspect of the present disclosure includes:

forming an electrode that includes two or more layers; and forming, on the electrode, a photoelectric conversion film that converts light to charge, in which the two or more layers include a first layer containing tantalum nitride, and an uppermost layer among the two or more layers contains a metal nitride.

Hereinafter, embodiments of the present disclosure are described in detail with reference to the drawings.

All the embodiments described below represent comprehensive or specific examples.

The numerical values, shapes, materials, constituents, arrangement and forms of connection of the constituents, steps, the orders of the steps, and the like described in the following embodiments are examples, and are not intended to limit the present disclosure. Various aspects described herein can be combined with one another as long as such combination does not cause discrepancy. In addition, among constituents in the following embodiments, constituents not recited in any of the independent claims each defining the most generic concept are described as optional constituents. In addition, each drawing does not necessarily exactly illustrate each configuration. In the following description, constituents having substantially the same functions are denoted by the same reference signs, and duplicate descriptions are omitted or simplified in some cases.

An imaging device according to an aspect of the present disclosure includes a photoelectric conversion film that performs photoelectric conversion to convert incident light to an electric signal in an upper layer, and a signal processing circuit unit that includes a silicon-based CMOS circuit to extract the electric signal obtained in the photoelectric conversion film to outside in a lower layer. Since in the imaging device according to the aspect of the present disclosure, the photoelectric conversion film and the signal processing circuit unit are stacked in this way, these can be independently designed.

In the following description, terms such as "top" "bottom", "side", and the like, are only used to designate the arrangement of members relative to each other, and are not intended to limit the orientation of the imaging device in use. The same applies to the X direction, the Y direction, and the Z direction. In the drawings, the X direction and the Y direction may correspond to the lateral direction. The Z direction may correspond to the top-bottom direction.

In the following description, a main component means a component that is contained in the largest amount based on mass. An example of the main component is a component that is contained in an amount of more than 50% by mass. A specific example of the main component is a component that is contained in an amount of more than 80% by mass.

First Embodiment 1-1. Overall Configuration of Imaging Device

An overall configuration of an imaging device 1 according to a first embodiment is described by using FIG. 1.

FIG. 1 is a schematic plan view illustrating a configuration of the imaging device 1 according to the first embodiment. As illustrated in FIG. 1, the imaging device 1 includes a plurality of pixels 100. The plurality of pixels 100 are disposed in a matrix form in the X-Y directions. In the imaging device 1, a pixel region 10 including the plurality of pixels 100 is configured.

The pixel region 10 includes a plurality of readout circuits. Specifically, each pixel 100 includes a readout circuit. In FIG. 1, illustration of the readout circuits is omitted.

Outside the pixel region 10 toward the outer periphery, a vertical driver 12, a timing generator 13, a signal processing circuit 14, a horizontal driver 15, a low voltage differential signaling (LVDS) device 16, a serial converter 17, a counter electrode voltage supplier 18, and a plurality of pads 19 are provided.

The vertical driver 12 performs control to read out signals from the respective readout circuits.

The timing generator 13 generates and supplies timing for driving the imaging device 1. The timing generator 13 also performs readout control such as skipped reading and partial reading.

The plurality of readout circuits form a plurality of columns. The signal processing circuit 14 includes a plurality of column circuits. The plurality of column circuits are associated one-to-one with the plurality of columns of the readout circuits. Each column circuit executes correlated double sampling (CDS) processing and subsequent AD conversion on a signal outputted from the column of the corresponding readout circuit. A digital signal thus obtained is stored in a memory provided for each column circuit. In FIG. 1, illustration of the column circuits is omitted.

The horizontal driver 15 performs control to sequentially read out signals of one line stored in the memory of the signal processing circuit 14 and output the signals to the LVDS device 16. The LVDS device 16 transmits digital signals in accordance with the LVDS technology. The serial converter 17 converts inputted parallel digital signals to serial digital signals and outputs the serial digital signals.

Note that the serial converter 17 can be omitted. In addition, it is possible to cause the signal processing circuit 14 to perform only the correlated double sampling processing and provide an AD conversion circuit instead of the LVDS device 16.

In addition, it is also possible to cause the signal processing circuit 14 to execute only the correlated double sampling processing, and omit the LVDS device 16 and the serial converter 17. In this case, an AD conversion circuit may be provided outside a chip in which the imaging device 1 is provided.

In addition, the signal processing circuit 14, the LVDS device 16, and the serial converter 17 may be disposed in each of a region on a first side and a region on a second side adjacent to the pixel region 10. In this case, the columns of the plurality of readout circuits in the pixel region 10 can be processed by the two signal processing circuits 14. For example, a half of the columns of these readout circuits (for example, odd columns) can be processed by the signal processing circuit 14 in the region on the first side adjacent to the pixel region 10. In addition, the other half of the columns of these readout circuits (for example, even columns) can be processed by the signal processing circuit 14 in the region on the second side adjacent to the pixel region 10.

1-2. Detailed Configuration of Imaging Device

Figure 2:
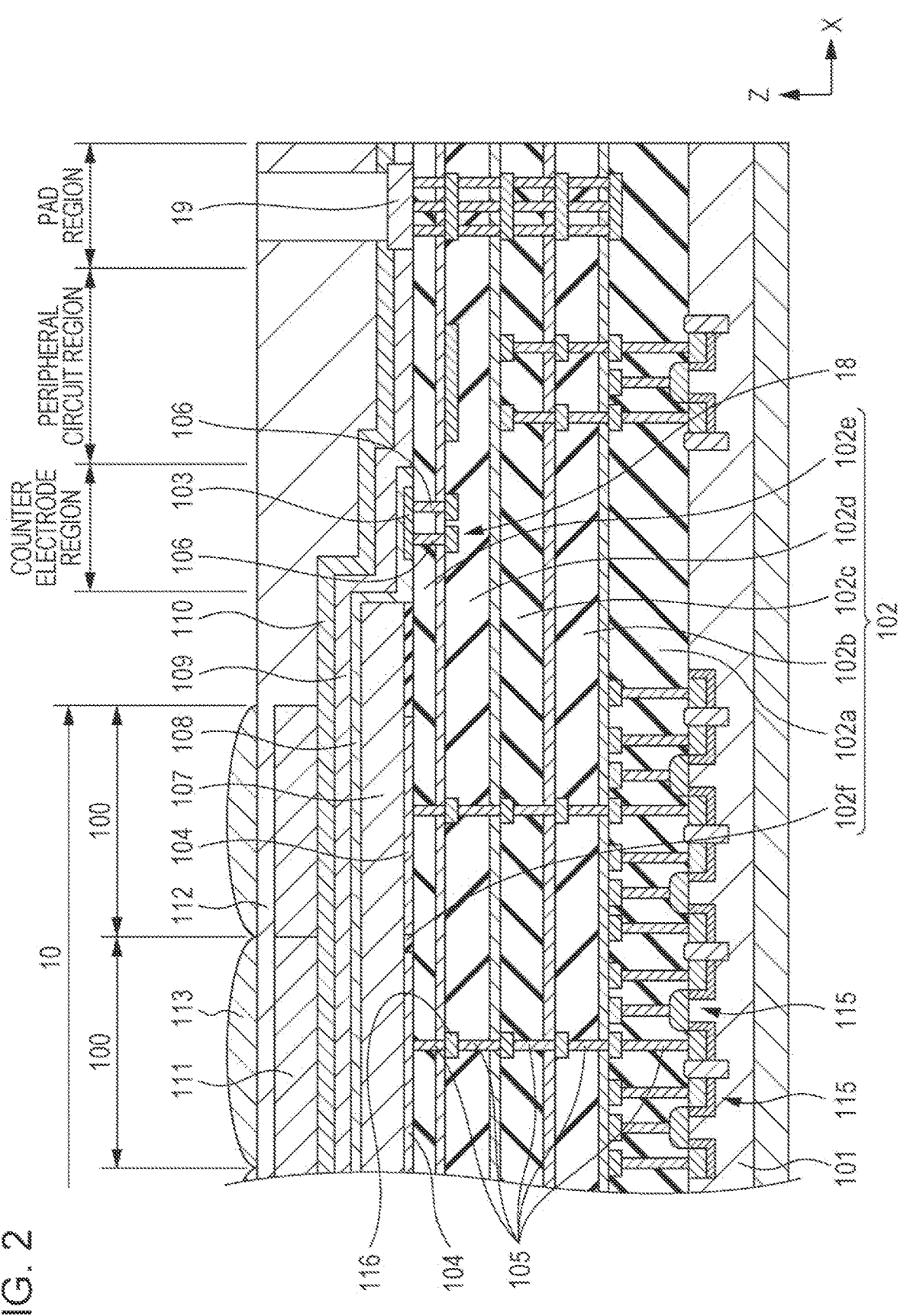
FIG. 2 is a schematic sectional view illustrating part of the imaging device.
Figure 3:
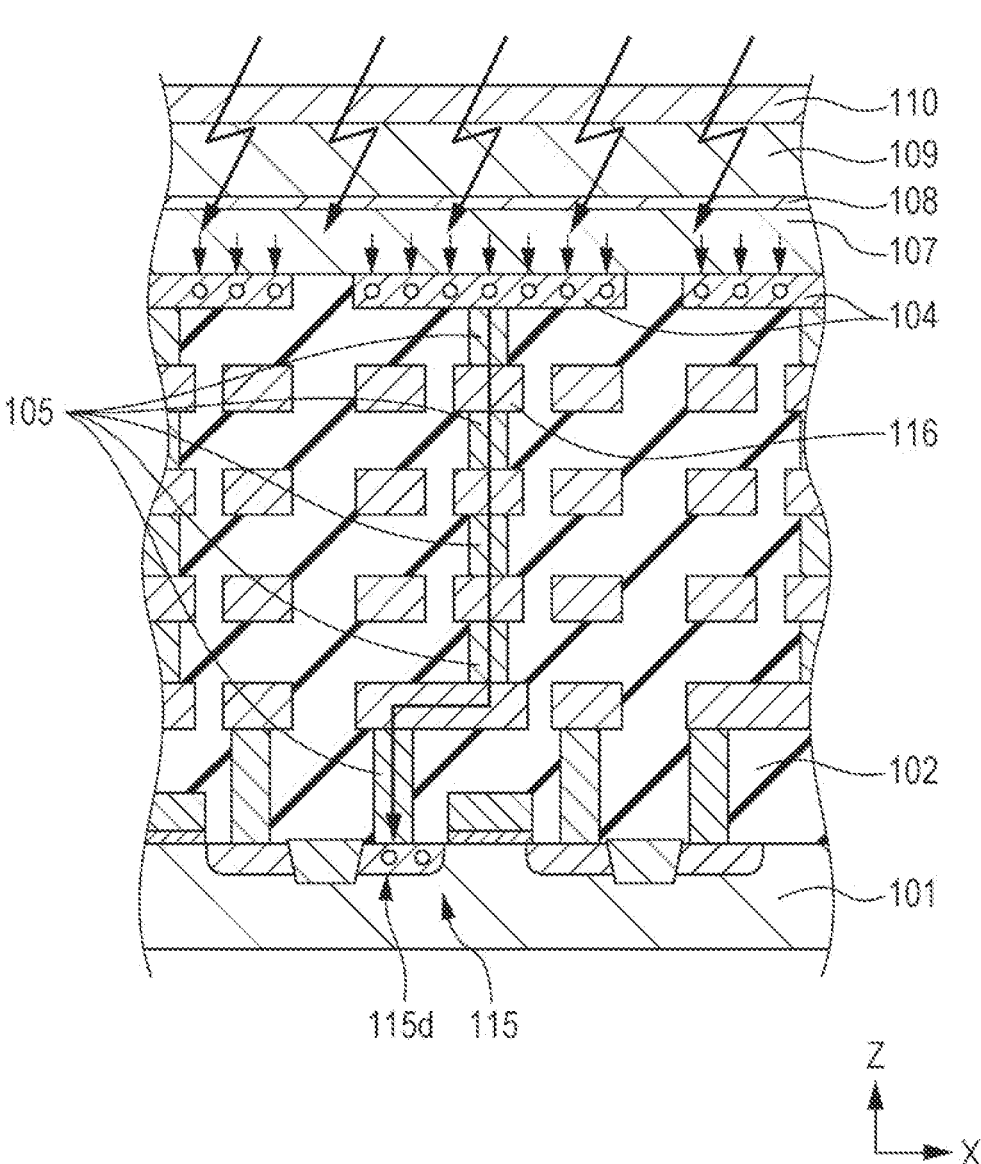
FIG. 3 is a schematic sectional view illustrating part of a pixel region of the imaging device.

The detailed configuration of the imaging device 1 is described by using FIGS. 2 and 3. FIG. 2 is a schematic sectional view illustrating part of the imaging device 1. Specifically, FIG. 2 illustrates part of a section taken along line II-II in FIG. 1. Note that in FIG. 1, some elements such as a connection electrode 103 in FIG. 2 is omitted. FIG. 3 is a schematic sectional view illustrating part of the pixel region 10 in the imaging device 1.

As illustrated in FIG. 2, the imaging device 1 includes a substrate 101 and an insulating layer 102. The insulating layer 102 is provided on the substrate 101. The insulating layer 102 is supported by the substrate 101. The insulating layer 102 includes configuration layers 102a, 102b, 102c, 102d, 102e, and 102f.

The substrate 101 is, for example, a glass substrate, a semiconductor substrate, or the like. The semiconductor contained in the substrate 101 as a semiconductor substrate is silicon (Si), or the like.

The insulating layer 102 contains, for example, silicon oxide ($SiO_2$), or the like. The configuration layers 102a to 102f contain, for example, silicon oxide ($SiO_2$), or the like.

In the pixel region 10, each pixel 100 includes a readout circuit 115. The readout circuit 115 is provided inside the substrate 101 and inside the insulating layer 102.

In the pixel region 10, a plurality of pixel electrodes 104 are provided on a principal surface of the insulating layer 102 on the upper side along the Z axis, that is, its top surface. The plurality of pixel electrodes 104 are two-dimensionally disposed on the top surface of the insulating layer 102 in two axes, that is, the X axis and the Y axis which is perpendicular to the sheet surface. In other words, the pixel electrodes 104 are disposed in a matrix form. These pixel electrodes 104 are disposed at certain intervals relative to each other. The disposition of the pixel electrodes 104 corresponds to the disposition of the pixels 100 in FIG. 1.

In the example of FIG. 2, the plurality of pixel electrodes 104 are associated one-to-one with the plurality of readout circuits 115. Each pixel electrode 104 is connected to the corresponding readout circuit 115 through a plug 105.

In the pixel region 10, in a gap between adjacent ones of the pixel electrodes 104, the configuration layer 102f is provided. The plurality of pixel electrodes 104 have a uniform film thickness, and the principal surfaces on the upper side in the Z axis, that is, the top surfaces are planarized.

On the pixel electrodes 104 and the configuration layer 102f, a photoelectric conversion film 107 is provided. On the photoelectric conversion film 107, a counter electrode 108, a buffer layer 109, and a sealing layer 110 are stacked in this order. On the sealing layer 110, a plurality of color filters 111 and a plurality of microlenses 113 are provided. In the example of FIG. 2, each pixel 100 has one color filter 111 and one microlens 113. The transmission wavelength band of each color filter 111 is set for each corresponding pixel 100. In addition, a planarizing layer 112 is provided to contain the portion located between the sealing layer 110 and the microlenses 113.

The photoelectric conversion film 107 generates charge depending on incident light. The charge generated by the photoelectric conversion film 107 is collected by the pixel electrodes 104.

In the present embodiment, the photoelectric conversion film 107 has a uniform film thickness on the pixel electrodes 104 in the pixel region 10. In regions other than that on the pixel electrodes 104, the film thickness of the photoelectric conversion film 107 may be uniform or may vary.

The photoelectric conversion film 107 contains, for example, an organic semiconductor. The photoelectric conversion film 107 may include one or two or more organic semiconductor layers. For example, the photoelectric conversion film 107 may include a carrier transport layer that transports electrons or holes, a blocking layer that blocks carriers, and the like, in addition to the photoelectric conversion layer that generates hole-electron pairs. For the organic semiconductor layers, organic p-type semiconductors and organic n-type semiconductors of known materials may be used. Note that the photoelectric conversion film 107 may be, for example, a mixed film of organic donor molecules and acceptor molecules, a mixed film of semiconductor carbon nanotubes and acceptor molecules, a quantum dot-containing film, or the like. The photoelectric conversion film 107 may contain an inorganic material such as amorphous silicon.

The counter electrode 108 faces the pixel electrode 104. The counter electrode 108 transmits light to the photoelectric conversion film 107.

The counter electrode 108 contains a conductive material having a light transmission property. The conductive material contained in the counter electrode 108 may be, for example, indium tin oxide (ITO), indium zinc oxide (IZO), or the like. In the present embodiment, the counter electrode 108 contains ITO as a main component.

Outside the pixel region 10 toward the outer periphery, a counter electrode region is provided. In the counter electrode region, the counter electrode 108 is connected to the connection electrode 103.

The plug 105 extends from the configuration layer 102a to the configuration layer 102e. The plug 105 electrically connects each pixel electrode 104 and the corresponding readout circuit 115. Specifically, the plug 105 electrically connects each pixel electrode 104 and the corresponding readout circuit 115 in cooperation with a multilayer interconnection. An uppermost layer interconnection 116, which is an interconnection of the uppermost layer among the multilayer interconnection, is disposed on the configuration layer 102d and below the configuration layer 102e.

A plug 106 extends through the configuration layer 102e. The counter electrode voltage supplier 18 is provided on the configuration layer 102d and below the configuration layer 102e. The plug 106 electrically connects the connection electrode 103 and the counter electrode voltage supplier 18. Voltage is applied to the counter electrode 108 through the counter electrode voltage supplier 18, the plug 106, and the connection electrode 103 in this order. Note that in FIG. 2, only part of the counter electrode voltage supplier 18 is illustrated.

The plugs 105 and 106 are formed, for example, by embedding a conductive material.

Each readout circuit 115 reads out a signal depending on the charge collected from the corresponding pixel electrode 104. The readout circuit 115 is configured by using metal oxide semiconductor field effect transistor (MOSFET) or thin film transistor (TFT), for example. The readout circuit 115 is shielded from light by a light-shielding layer provided inside the insulating layer 102 or the like, for example. In FIG. 2, illustration of the light-shielding layer is omitted.

Although not illustrated, in a region other than the region where the color filter 111 are provided on the sealing layer 110, a light-shielding layer is provided. The light-shielding layer blocks external light toward a region other than the effective pixel region. In this way, light is prevented from being incident on the photoelectric conversion film 107 in the region other than the effective pixel region.

In the present embodiment, as illustrated in FIGS. 1 and 2, to one counter electrode 108, a combination of one connection electrode 103, at least one plug 106, and at least one counter electrode voltage supplier 18 is electrically connected. However, to one counter electrode 108, two or more sets of the above-described combination may be electrically connected. The number of sets of the above-described combination to be electrically connected to one counter electrode 108 can be determined by increasing or decreasing the number as appropriate in consideration of the area of the chip, the width of the interconnection, and the like in the device.

Outside the counter electrode region toward the outer periphery, a peripheral circuit region is provided. In the peripheral circuit region, a peripheral circuit is provided. The peripheral circuit includes the vertical driver 12, the timing generator 13, the signal processing circuit 14, the horizontal driver 15, the LVDS device 16, the serial converter 17, and the counter electrode voltage supplier 18 illustrated in FIG. 1. Metal layers in the peripheral circuit region are formed by using copper (Cu), for example.

Outside the peripheral circuit region toward the outer periphery, a pad region is provided. In the pad region, a recess that penetrates the planarizing layer 112, the sealing layer 110, and the buffer layer 109 to reach the top surface of the configuration layer 102d is provided. On the bottom surface of the recess, a pad 19 is provided. Although not illustrated in detail, the pad 19 is electrically connected to various circuits such as an input/output circuit for signals and voltage supply.

Next, the imaging mechanism is described by using FIG. 3.

As illustrated in FIG. 3, light that has been incident from above in the Z axis passes through the sealing layer 110, the buffer layer 109, and the counter electrode 108 to be incident on the photoelectric conversion film 107. The photoelectric conversion film 107 photoelectrically converts the incident light to generate charge while an appropriate bias voltage is being applied to the photoelectric conversion film 107 by the pixel electrode 104 and the counter electrode 108. Here, a difference in potential between the counter electrode 108 and the pixel electrode 104 serves as the bias voltage applied to the photoelectric conversion film 107. In FIG. 3, the charge is represented by white circles.

The charge generated in the photoelectric conversion film 107 as described above is transferred from the pixel electrode 104 to the accumulation diode 115d in the readout circuit 115 through the plug 105, and is temporarily accumulated in the accumulation diode 115d. Then, the charge is outputted as a signal at an appropriate timing by the opening and closing operation of the transistor element, or the like in the readout circuit 115.

1-3. Configuration and the Like of Electrodes

The configuration and the like of the electrodes of the present embodiment are described. In the following description, terms a first electrode and a second electrode are used. The first electrode may correspond to the counter electrode 108. The second electrode may correspond to the pixel electrode 104. The second electrode may correspond to the connection electrode 103. The first electrode may have the features described above and below regarding the counter electrode 108. The second electrode may have the features described above and below regarding the pixel electrode 104 and the connection electrode 103. However, the electrodes that may correspond to the first electrode and the second electrode are not limited to these.

The imaging device 1 of the present embodiment includes the first electrode, the photoelectric conversion film 107, and the second electrode. The photoelectric conversion film 107 is located below the first electrode. The second electrode is located below the first electrode.

In the present embodiment, the first electrode is the counter electrode 108. When viewed from above, the first electrode and the photoelectric conversion film 107 at least partially overlap each other. Specifically, when viewed from above, a region of greater than or equal to 80% of the area of the photoelectric conversion film 107 overlaps the first electrode. When viewed from above, an entirety of the photoelectric conversion film 107 may overlap the first electrode.

In an example, the second electrode is the pixel electrode 104. In this case, the photoelectric conversion film 107 may be disposed between the first electrode and the second electrode. In this case, when viewed from above, a region of greater than or equal to 80% or the entirety of the area of the second electrode may overlap the first electrode. In addition, in this case, when viewed from above, a region of greater than or equal to 80% or the entirety of the area of the second electrode may overlap the photoelectric conversion film 107.

In another example, the second electrode is the connection electrode 103. In this case, when viewed from above, at least part, for example, the entirety of the second electrode may be at a position overlapping the first electrode. When viewed from above, at least part, for example, the entirety of the second electrode may be at a position not overlapping the first electrode. In addition, in this case, when viewed from above, at least part, for example, the entirety of the second electrode may be at a position not overlapping the photoelectric conversion film 107.

In the present embodiment, the insulating layer 102 is on the substrate 101. The second electrode is on the insulating layer 102. Specifically, the second electrode is in contact with the insulating layer 102.

FIGS. 4A to 4E are schematic sectional views illustrating configurations of the second electrode 120 of the present embodiment. In the examples of FIGS. 4A to 4E, the second electrode 120 is connected to the plug 130. Specifically, a bottom surface 120b of the second electrode 120 is connected to the plug 130.

The plug 130 may correspond to the plug 105 or plug 106. The plug 130 may have the features described above and below regarding the plug 105. The plug 130 may have the features described above and below regarding the plug 106. However, the plugs that may correspond to the plug 130 are not limited to these.

In the examples of FIGS. 4A to 4E, the second electrode 120 has a multilayer structure formed of two or more layers. An uppermost layer 120t of the second electrode 120 contains a metal nitride. The second electrode 120 has a first layer 121. The first layer 121 contains tantalum nitride (TaN). Specifically, the uppermost layer 120t of the second electrode 120 contains a metal nitride as a main component. The first layer 121 contains tantalum nitride as a main component.

Since the second electrode 120 has a multilayer structure, the second electrode 120 has not only the first layer 121 but also a different layer other than the first layer 121. This different layer may contain a material having a lower electrical resistance than that of tantalum nitride. Accordingly, the second electrode 120, when having a multilayer structure, may have a lower electrical resistance than in the case where the second electrode 120 is a single layer of the first layer 121. In addition, this different layer may contain a material that is easier to process than tantalum nitride. Accordingly, the second electrode 120, when having a multilayer structure, may have a higher processability than in the case where the second electrode 120 is a single layer of the first layer 121.

A metal nitride has a high chemical stability. Accordingly, the uppermost layer 120t of the second electrode 120 can have a high chemical stability. Therefore, the second electrode 120 can be protected from chemical reaction by the uppermost layer 120t. This action can be exerted in the case where the uppermost layer 120t is exposed to oxygen or a high temperature during the process of manufacturing the imaging device 1, for example.

Tantalum nitride has an amorphous crystalline structure. An amorphous crystalline structure makes it possible to achieve a dense structure. Accordingly, in the second electrode 120, diffusion of a metal derived from outside the second electrode 120 can be suppressed by the first layer 121. In other words, in the second electrode 120, the first layer 121 can exert a barrier property against a metal derived from outside the second electrode 120. This barrier property may be referred to as a metal barrier property. The above-described metal is, for example, copper. That is, the second electrode 120 can have a Cu barrier property based on the first layer 121.

Note that there are also materials having amorphous crystalline structures besides tantalum nitride. For example, titanium falls under the materials having amorphous crystalline structures. However, tantalum nitride has a high density among the materials having amorphous crystalline structures. Accordingly, tantalum nitride has a high metal barrier property among the materials having amorphous crystalline structures. Specifically, tantalum nitride has a high density, and thus a high metal barrier property, as compared with titanium. In general, in a nitride obtained by adding nitrogen to a single element, nitrogen can contribute to an improvement in density. Therefore, nitrogen in tantalum nitride can contribute to an improvement in density.

In the examples of FIGS. 4A to 4E, the plug 130 contains a metal. In these examples, it is possible to extract charge from the second electrode 120 through the plug 130 while suppressing diffusion of the metal derived from the plug 130 in the second electrode 120. Specifically, the plug 130 contains a metal as a main component.

In the examples of FIGS. 4A to 4E, the plug 130 contains copper (Cu). In the second electrode 120 of these examples, diffusion of copper derived from the plug 130 can be suppressed. In addition, copper is a material used in general as multilayer interconnections of devices manufactured through a semiconductor process, and thus has a high process affinity. Accordingly, it is advantageous that the plug 130 contains copper from the viewpoint of reducing manufacturing cost as well. In this context, copper is metal copper. Specifically, the plug 130 contains copper as a main component.

The plug 130 may contain a material other than copper. For example, the plug 130 may contain tungsten. In this context, tungsten is metal tungsten. The plug 130 may contain tungsten as a main component.

In the examples of FIGS. 4A to 4E, the metal of the plug 130 is in contact with the second electrode 120. Specifically, the copper of the plug 130 is in contact with the second electrode 120. In addition, specifically, the metal of the plug 130 is in contact with the bottom surface 120b of the second electrode 120.

In the examples of FIGS. 4A to 4D, the uppermost layer 120t is a second layer 122. The second layer 122 is a layer different from the first layer 121. Since tantalum nitride contained in the first layer 121 is a metal nitride, tantalum nitride has advantages derived from metal nitrides. However, tantalum nitride also has unique disadvantages. In terms of this point, in the examples of FIGS. 4A to 4D, not only the first layer 121 but also the second layer 122 contains metal nitride. In these examples, since the second layer 122 contains a metal nitride other than tantalum nitride, it is possible to have advantages derived from the metal nitride while suppressing disadvantages derived from tantalum nitride. For example, as the uppermost layer 120t, a layer containing a material having a lower electrical resistance than that of tantalum nitride can be employed. In addition, for example, as the uppermost layer 120t, a layer containing a material which is easier to process than tantalum nitride can be employed.

In the examples of FIGS. 4A to 4D, the first layer 121 is thinner than the second layer 122. In this case, it is easy to have the above-described advantages while suppressing the above-described disadvantages. However, the thickness of the first layer 121 may be equal to the thickness of the second layer 122. The first layer 121 may be thicker than the second layer 122.

The thickness of the first layer 121 is, for example, greater than or equal to 5% and less than or equal to 70% of the thickness of the second electrode 122. The thickness of the first layer 121 may be, for example, greater than or equal to 10% and less than or equal to 60%, or may be greater than or equal to 10% and less than or equal to 40%, of the thickness of the second electrode 122.

The thickness of the first layer 121 is, for example, 5 to 70 nm. The thickness of the first layer 121 may be 10 to 60 nm, or may be 10 to 40 nm.

The thickness of the second layer 122 is, for example, 25 to 90 nm. The thickness of the second layer 122 may be 30 to 90 nm, or may be 30 to 70 nm.

The second layer 122 may contain a material different from that of the first layer 121. Specifically, the second layer 122 may contain as a main component a material different from that of the first layer 121. The material different from that of the first layer 121 is, specifically, a material other than tantalum nitride.

In the examples of FIGS. 4A to 4D, the second layer 122 contains titanium nitride (TiN). Titanium nitride has a smaller electrical resistance, and is easier to process, than tantalum nitride. Accordingly, the second layer 122 can fall under the layer containing a material having a lower electrical resistance than that of the tantalum nitride. In addition, the second layer 122 can fall under the layer containing a material which is easier to process than tantalum nitride. Specifically, the second layer 122 contains titanium nitride as a main component.

Figure 4A:
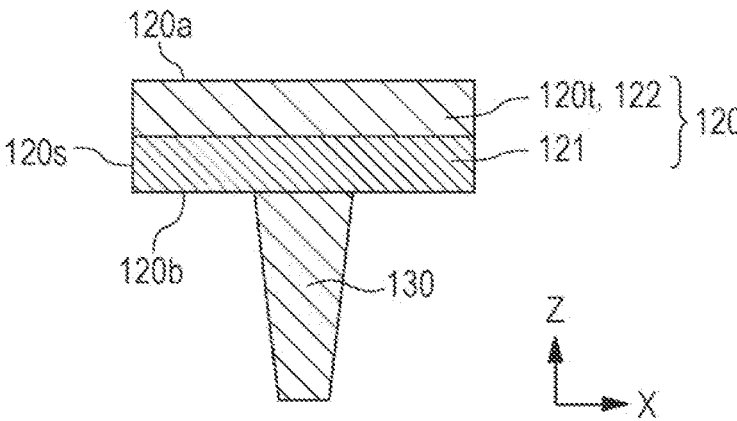
FIG. 4A is a schematic sectional view illustrating a configuration of a second electrode.
Figure 4B:
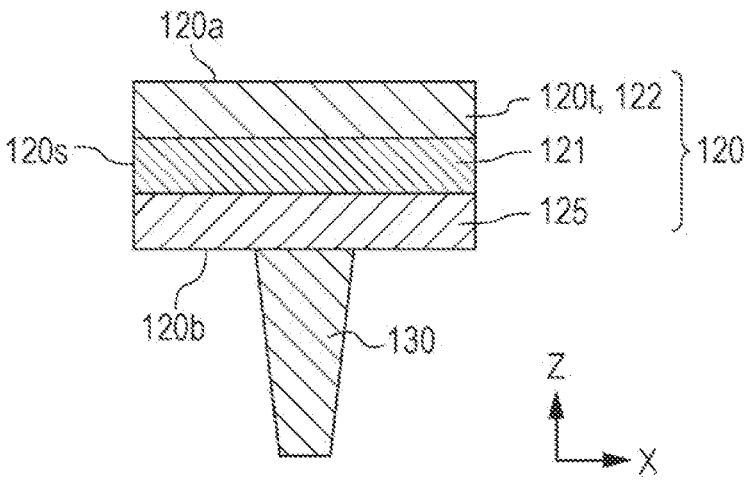
FIG. 4B is a schematic sectional view illustrating a configuration of the second electrode.
Figure 4C:
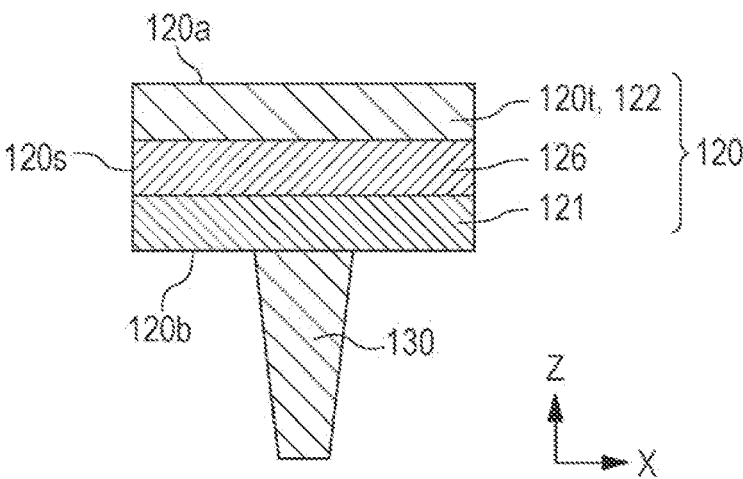
FIG. 4C is a schematic sectional view illustrating a configuration of the second electrode.
Figure 4D:
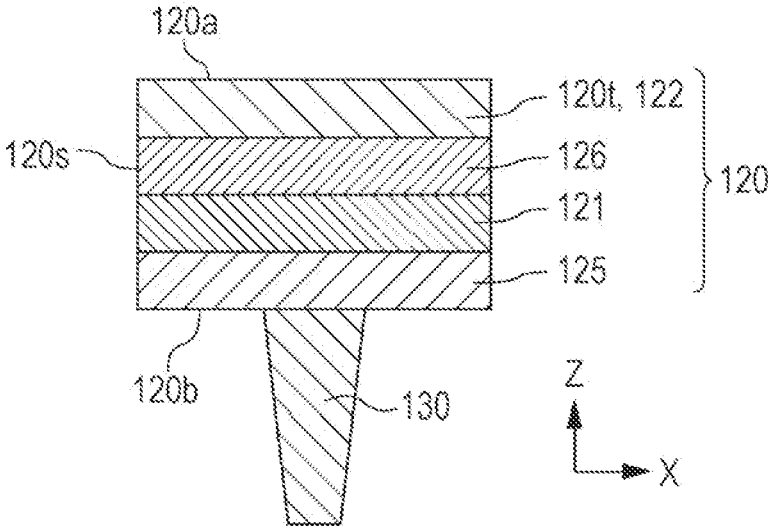
FIG. 4D is a schematic sectional view illustrating a configuration of the second electrode.
Figure 4E:
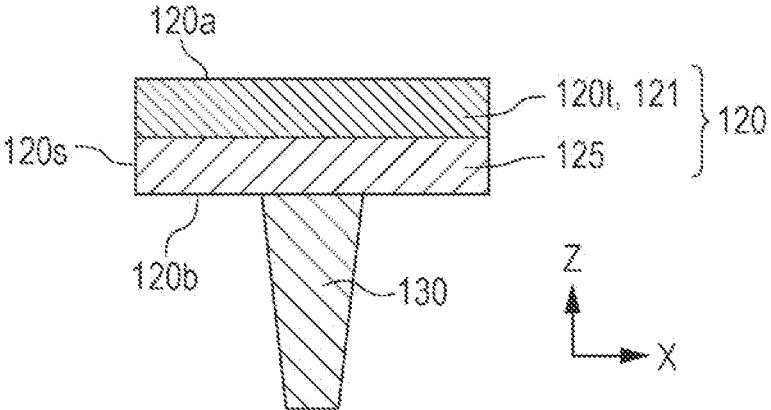
FIG. 4E is a schematic sectional view illustrating a configuration of the second electrode.

In the example of FIG. 4E, the uppermost layer 120*t* is the first layer 121. Accordingly, the uppermost layer 120*t* contains tantalum nitride. Therefore, in the uppermost layer 120*t*, diffusion of a metal derived from outside the second electrode 120 can be suppressed.

In the examples of FIGS. 4B, 4D, and 4E, a lowermost layer 125 of the second electrode 120 contains a metal. According to these examples, it is easy to join the second electrode 120 to a structure containing a material having a high joinability with the metal. Specifically, the lowermost layer 125 contains a metal as a main component.

In the examples of FIGS. 4B, 4D, and 4E, the lowermost layer 125 of the second electrode 120 contains tantalum (Ta). According to these examples, it is easy to join the second electrode 120 to a structure containing a material having a high joinability with tantalum. For example, copper that may be contained in the plug 130 has a high joinability with tantalum. In this context, tantalum is metal tantalum. Specifically, the lowermost layer 125 contains tantalum as a main component.

In a typical example, the lowermost layer 125 is thinner than the first layer 121. However, the thickness of the lowermost layer 125 may be equal to the thickness of the first layer 121. In addition, the lowermost layer 125 may be thicker than the first layer 121.

The thickness of the lowermost layer 125 is, for example, 5 to 70 nm. The thickness of the lowermost layer 125 may be 10 to 60 nm, or may be 10 to 40 nm.

In the examples of FIGS. 4A and 4C, the lowermost layer of the second electrode 120 is the first layer 121. Accordingly, the lowermost layer contains tantalum nitride. Therefore, in the lowermost layer, it is possible to suppress diffusion of a metal derived from outside the second electrode 120.

In the examples of FIGS. 4C and 4D, the second electrode 120 has a layer 126. The layer 126 contains a material having an amorphous crystalline structure. Accordingly, the layer 126 makes it possible to improve the metal barrier property of the second electrode 120. Specifically, the layer 126 contains a material having an amorphous crystalline structure as a main component.

The material having an amorphous crystalline structure which is contained in the layer 126 in the examples of FIGS. 4C and 4D is a material other than tantalum nitride, but may also be tantalum nitride. In an example, the layer 126 contains titanium (Ti). Titanium is an example of the material having an amorphous crystalline structure. In this context, titanium is metal titanium. Specifically, the layer 126 contains tantalum nitride or titanium as a main component.

In a typical example, the layer 126 is thinner than the first layer 121. However, the thickness of the layer 126 may be equal to the thickness of the first layer 121. In addition, the layer 126 may be thicker than the first layer 121.

In an example, the second electrode 120 is the pixel electrode 104. The uppermost layer 120*t* is a layer closest to the photoelectric conversion film 107 in the pixel electrode 104. As described above, since the uppermost layer 120*t* contains a metal nitride, the uppermost layer 120*t* has a high chemical stability. Accordingly, this configuration is advantageous from the viewpoint of ensuring stability of the photoelectric conversion film 107. The top surface 120*a* of the second electrode 120 may be in contact with the photoelectric conversion film 107. The metal nitride contained in the uppermost layer 120*t* is, for example, titanium nitride. Note that a side surface 120*s* is a surface connecting the top surface 120*a* and the bottom surface 120*b*.

In an example, the second electrode 120 is the connection electrode 103. The first electrode is the counter electrode 108. The second electrode 120 and the first electrode are electrically connected. The first electrode contains ITO. The uppermost layer 120*t* contains titanium nitride. The work function of titanium nitride is close to the work function of ITO. This is advantageous from the viewpoint of performing appropriate photoelectric conversion in the photoelectric conversion film 107. Specifically, the first electrode contains ITO as a main component. The uppermost layer 120*t* contains titanium nitride as a main component.

A difference between the work function of the second electrode 120 serving as the connection electrode 103 and the work function of the first electrode is, for example, less than or equal to 1.5 eV. This difference may be less than or equal to 1.0 eV.

Figure 5:
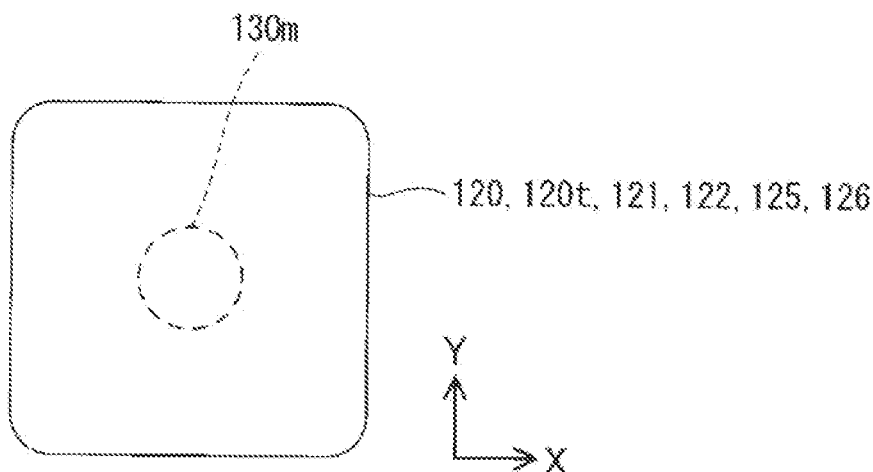
FIG. 5 is a schematic top view illustrating a configuration of the second electrode.

FIG. 5 is a schematic top view illustrating a configuration of the second electrode 120 according to an example. As illustrated in FIG. 5, when viewed from above, outer peripheral ends of the respective layers of the multilayer structure of the second electrode 120 coincide with each other over the entire periphery. Note that in FIG. 5, the contour of a connection surface 130*m* of the plug 130 with the second electrode 120 is indicated with a dotted line.

In the examples of FIGS. 4A and 4E, the number of layers of the second electrode 120 is 2. The second electrode 120 having a two-layer structure can be simple. This is advantageous from the viewpoint of reducing the number of manufacturing steps and manufacturing cost.

In the examples of FIGS. 4B to 4D, the number of layers of the second electrode 120 is greater than or equal to 3. This is advantageous from the viewpoint of imparting various properties to the second electrode 120.

Specific examples of the configurations which the second electrodes 120 of FIGS. 4A to 4E can take are as follows.

The second electrode 120 of FIG. 4A has a two-layer structure in which the first layer 121 containing tantalum nitride as a main component and the uppermost layer 120*t* containing titanium nitride as a main component are stacked in this order from bottom to top. The plug 130 is connected to the first layer 121.

The second electrode 120 of FIG. 4B has a three-layer structure in which the lowermost layer 125 containing tantalum as a main component, the first layer 121 containing tantalum nitride as a main component, and the uppermost layer 120*t* containing titanium nitride as a main component are stacked in this order from bottom to top. The plug 130 is connected to the lowermost layer 125.

The second electrode 120 of FIG. 4C has a three-layer structure in which the first layer 121 containing tantalum nitride as a main component, the layer 126 containing titanium as a main component, and the uppermost layer 120*t* containing titanium nitride as a main component are stacked in this order from bottom to top. The plug 130 is connected to the first layer 121.

The second electrode 120 of FIG. 4D has a four-layer structure in which the lowermost layer 125 containing tantalum as a main component, the first layer 121 containing tantalum nitride as a main component, the layer 126 containing titanium as a main component, and the uppermost layer 120*t* containing titanium nitride as a main component are stacked in this order from bottom to top. The plug 130 is connected to the lowermost layer 125.

The second electrode 120 of FIG. 4E has a two-layer structure in which the lowermost layer 125 containing tantalum as a main component and the uppermost layer 120*t* containing tantalum nitride as a main component and functioning as the first layer 121 are stacked in this order from bottom to top. The plug 130 is connected to the lowermost layer 125.

The materials that may be contained in the second electrode 120 are not limited to those given in the above description. Other materials that may be contained in the second electrode 120 include aluminum (Al), tungsten (W), and the like, for example. In this context, aluminum is metal aluminum. Tungsten is metal tungsten. The second electrode 120 may contain one material selected from these as a main component.

As understood from the above description, the second electrode 120 may have a layer containing a metal and a layer containing a metal nitride. Specifically, the second electrode 120 may have a layer containing a metal as a main component and a layer containing a metal nitride as a main component.

In addition, the second electrode 120 may have at least two layers each containing a metal nitride. Specifically, the second electrode 120 may have at least two layers each containing a metal nitride as a main component.

Here, "when viewed from above" and "top-bottom direction" are described. "When viewed from above" has the same meaning as "when seen through from above". In a typical example, the features of the second electrode 120 "when viewed from above" correspond to the features of the second electrode 120 when the second electrode 120 is viewed in a plan view. The top-bottom direction may be the same as the thickness direction of the second electrode 120. The top-bottom direction may be the same as the thickness direction of the photoelectric conversion film 107. The top-bottom direction may be the same as the thickness direction of the substrate 101.

1-4. Method For Manufacturing Imaging Device

Hereinafter, an example of a method for manufacturing the imaging device 1 according to the present embodiment is described. FIGS. 6A to 6F are each a schematic process view illustrating part of the process of manufacturing the imaging device 1. Note that in the following description, steps and the like regarding the formation of the pixel electrode 104 are described, and description of the other steps is omitted.

Figure 6A:
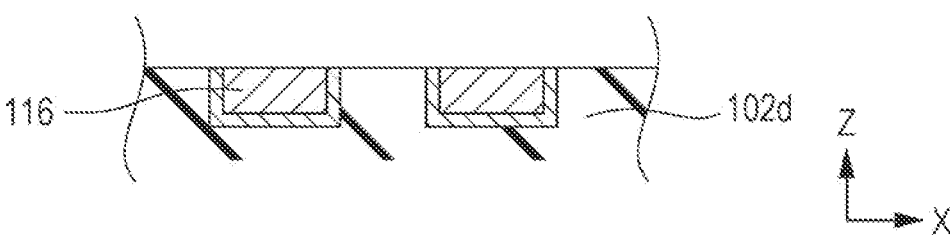
FIG. 6A is a schematic process view illustrating part of a process of manufacturing the imaging device.

A structure is formed in which a configuration layer 102*d* and an uppermost layer interconnection 116 form the top surface as illustrated in FIG. 6A.

Figure 6B:
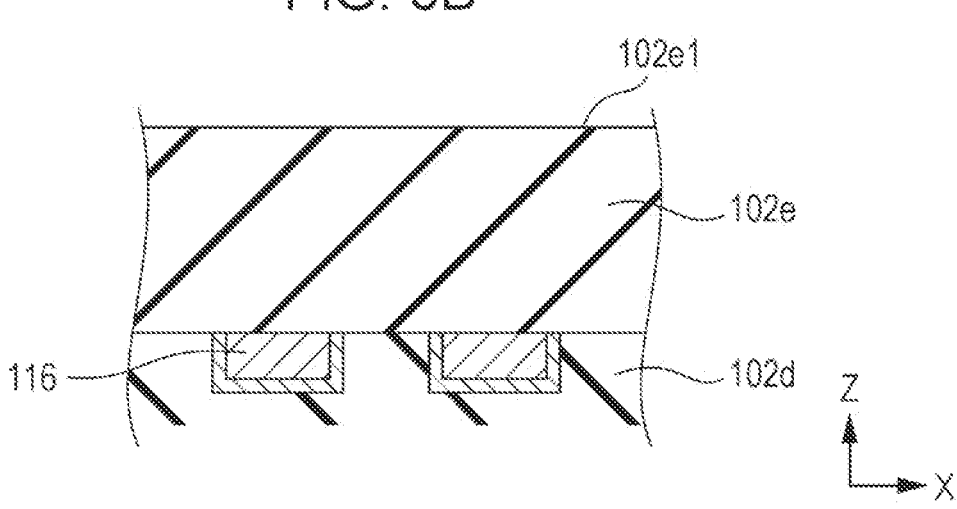
FIG. 6B is a schematic process view illustrating part of the process of manufacturing the imaging device.

Next, a configuration layer 102*e* is formed on the structure of FIG. 6A by the chemical vapor deposition (CVD) method or the like. In this way, a structure illustrated in FIG. 6B is obtained. The configuration layer 102*e* contains, for example, silicon oxide (SiO$_2$). The film thickness of the configuration layer 102*e* is, for example, 500 nm.

Next, a first resist pattern having a first via pattern is formed on the configuration layer 102*e* by the lithography method. Illustration of the first resist pattern is omitted.

Next, the configuration layer 102*e* is etched by dry etching with the first resist pattern as a mask. In this way, first holes 141 are formed in the configuration layer 102*e*, so that a structure illustrated in FIG. 6C is obtained.

Next, the first resist pattern is removed by ashing.

Figure 6C:
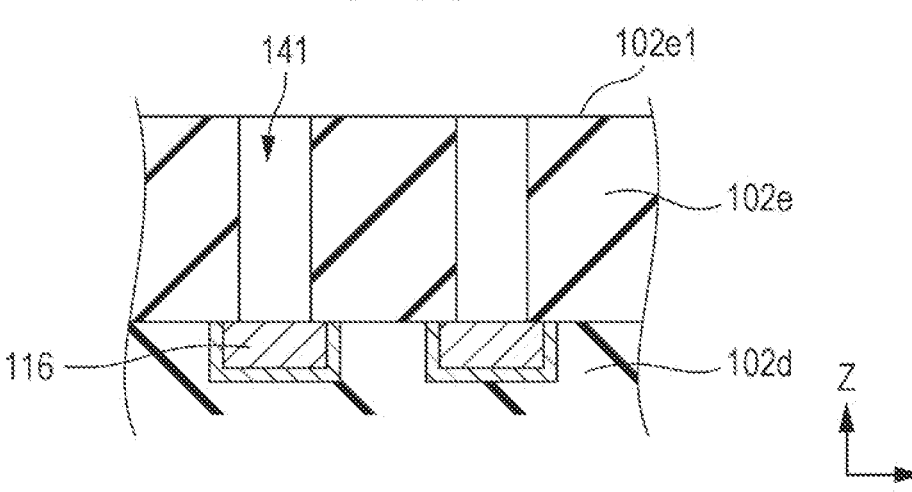
FIG. 6C is a schematic process view illustrating part of the process of manufacturing the imaging device.

Next, tantalum nitride, tantalum, and copper are deposited in this order from above the structure illustrated in FIG. 6C such that the first holes 141 are filled by the CVD method or the sputtering method or the like. In this way, a first barrier film 105*a* and a first metal body 105*b* are formed. The first barrier film 105*a* has a first outer layer 105*a*1 and a first inner layer 105*a*2 located inside the first outer layer 105*a*1. The first metal body 105*b* is covered with the first inner layer 105*a*2 from below and side. The first inner layer 105*a*2 is covered with the first outer layer 105*a*1 from below and side. The first outer layer 105*a*1 contains tantalum nitride. The first inner layer 105*a*2 contains tantalum. The first metal body 105*b* contains copper. The first metal body 105*b* is columnar.

After the above-described deposition steps, excess tantalum nitride, tantalum, and copper are deposited on a top surface 102*e*1 of the configuration layer 102*e*. These excess materials are removed by polishing using the chemical-mechanical polishing (CMP) method. In this way, a structure in which a plug 105 including the first barrier film 105*a* and the first metal body 105*b* is formed and the excess materials have been removed as illustrated in FIG. 6D is obtained.

Note that regarding the first barrier film 105*a*, the material of the first outer layer 105*a*1 may be changed from tantalum nitride to titanium nitride (TiN), and the material of the first inner layer 105*a*2 may be changed from tantalum to titanium (Ti). The material of the first metal body 105*b* may be changed from copper to tungsten (W).

On the structure of FIG. 6D, tantalum nitride and titanium nitride are sequentially deposited by the CVD method or the physical vapor deposition (PVD) method. In this way, a stacked body 104*x* is formed on the plug 105 and the configuration layer 102*e*, so that a structure illustrated in FIG. 6E is obtained. The stacked body 104*x* includes a lower layer 104*ax* containing tantalum nitride and an upper layer 104*bx* containing titanium nitride. The total film thickness of the stacked body 104*x* is, for example, 100 nm. The stacked body 104*x* spreads over a plurality of the plugs 105 when viewed from above.

Next, on the stacked body 104*x*, a second resist pattern having a pixel electrode pattern is formed by the lithography method. Illustration of the second resist pattern is omitted.

Next, the stacked body 104*x* is etched by dry etching with the second resist pattern as a mask. This divides the stacked body 104*x* into a plurality of pieces. In this way, a structure illustrated in FIG. 6F in which a plurality of pixel electrodes 104 are formed on the configuration layer 102*e* is obtained. In this structure, the plurality of pixel electrodes 104 are separate from each other, and each pixel electrode 104 is connected to the corresponding one plug 105. Each pixel electrode 104 includes a lower layer 104*a* containing tantalum nitride and an upper layer 104*b* containing titanium nitride. The pixel electrode 104 are etched from above in a later step, so that the top surfaces are planarized.

Next, the second resist pattern is removed by ashing. The ashing gas is oxygen. Specifically, in this ashing, the second resist pattern is removed by oxygen plasma.

Note that the materials of the stacked body 104$x$ are not limited to those given in the above description. The materials that may be contained in the stacked body 104$x$ are selected from materials that can be etched. The material that can be etched include titanium (Ti), tantalum (Ta), aluminum (Al), tungsten (W), and the like besides tantalum nitride (TaN) and titanium nitride (TiN).

In the present embodiment, the plug 106 is formed in a manner similar to the plug 105. Specifically, the plug 106 and the plug 105 may be collectively fabricated in the same steps. The plug 106 has a configuration similar to that of the plug 105. Specifically, the plug 106 is formed of the same materials as those of the plug 105. The connection electrode 103 is formed in a manner similar to the pixel electrode 104. Specifically, the connection electrode 103 and the pixel electrode 104 may be collectively fabricated in the same steps. The connection electrode 103 has a configuration similar to that of the pixel electrode 104. Specifically, the connection electrode 103 is formed of the same materials as those of the pixel electrode 104. These points also apply to embodiments described below.

However, the method for manufacturing the plug 106 may be different from the method for manufacturing the plug 105. The plug 106 and the plug 105 do not have to be collectively fabricated in the same steps. The plug 106 may have a different configuration from that of the plug 105. The method for manufacturing the connection electrode 103 may be different from the method for manufacturing the pixel electrode 104. The connection electrode 103 and the pixel electrode 104 do not have to be collectively fabricated in the same steps. The connection electrode 103 may have a configuration different from that of the pixel electrode 104. These points also apply to the embodiments described below.

A configuration as below may also be employed. That is, a plurality of the second electrodes 120 are present. The plurality of second electrodes 120 include a third electrode and a fourth electrode. The first layer 121 of the third electrode is thicker than the first layer 121 of the fourth electrode. Such a configuration makes it easy to make the metal barrier property of the third electrode higher than the metal barrier property of the fourth electrode.

The third electrode corresponds, for example, to the connection electrode 103. The fourth electrode corresponds, for example, to the pixel electrode 104.

The thickness of the first layer 121 of the third electrode may be equal to the thickness of the first layer 121 of the fourth electrode. The first layer 121 of the third electrode may be thinner than the first layer 121 of the fourth electrode.

The second layer 122 of the third electrode may be thicker than the second layer 122 of the fourth electrode. The thickness of the second layer 122 of the third electrode may be equal to the thickness of the second layer 122 of the fourth electrode. The second layer 122 of the third electrode may be thinner than the second layer 122 of the fourth electrode.

The uppermost layer 120$t$ of the third electrode may be thicker than the uppermost layer 120$t$ of the fourth electrode. The thickness of the uppermost layer 120$t$ of the third electrode may be equal to the thickness of the uppermost layer 120$t$ of the fourth electrode. The uppermost layer 120$t$ of the third electrode may be thinner than the uppermost layer 120$t$ of the fourth electrode.

The lowermost layer 125 of the third electrode may be thicker than the lowermost layer 125 of the fourth electrode. The thickness of the lowermost layer 125 of the third electrode may be equal to the thickness of the lowermost layer 125 of the fourth electrode. The lowermost layer 125 of the third electrode may be thinner than the lowermost layer 125 of the fourth electrode.

The layer 126 of the third electrode may be thicker than the layer 126 of the fourth electrode. The thickness of the layer 126 of the third electrode may be equal to the thickness of the layer 126 of the fourth electrode. The layer 126 of the third electrode may be thinner than the layer 126 of the fourth electrode.

1-5. Expression of the Cu Barrier Property by the Electrode

As described above, the method for manufacturing the imaging device 1 includes a step of removing the second resist pattern by ashing. In this ashing, the top surface of the pixel electrode 104 is exposed to oxygen, which is the ashing gas.

Figure 7A:
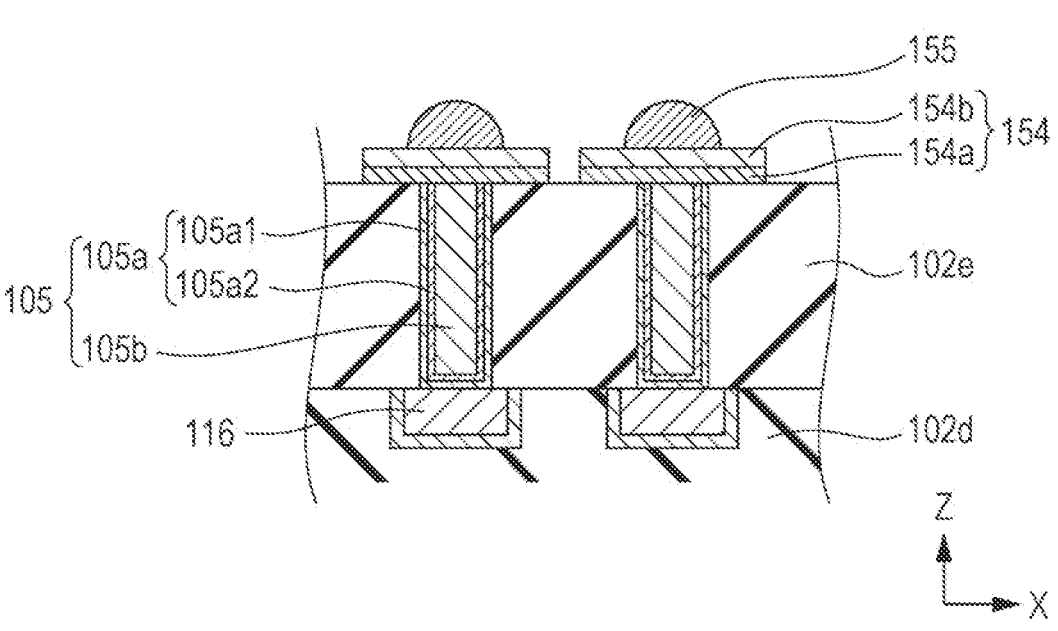
FIG. 7A is a schematic sectional view illustrating a state where copper has been abnormally oxidized.
Figure 7B:
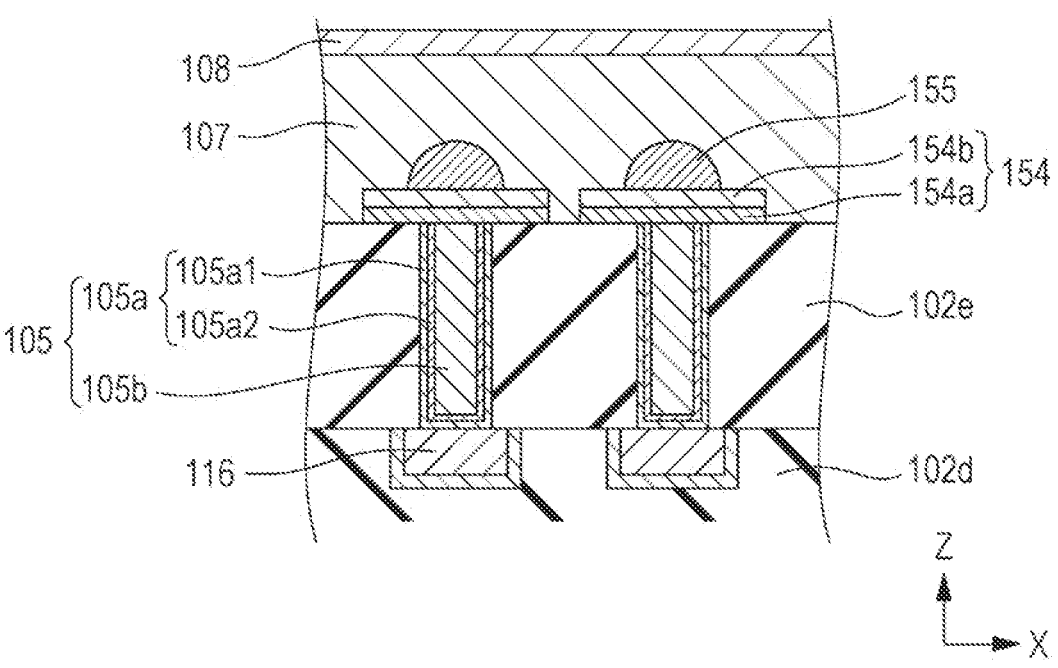
FIG. 7B is a schematic sectional view illustrating a state where copper has been abnormally oxidized.

Here, copper of the plug 105 can be diffused into the pixel electrode 104. This diffusion can cause failures such as abnormal oxidation of copper. Hereinafter, action of suppressing diffusion of copper into the pixel electrode 104, that is, the Cu barrier property is described. FIGS. 7A and 7B are schematic sectional views illustrating the state where copper has been abnormally oxidized.

Assume that the pixel electrode 154 does not contain tantalum nitride but instead contains titanium nitride. Specifically, as illustrated in FIG. 7A, the pixel electrode 154 is assumed to have a structure in which a titanium nitride layer 154$b$ is disposed on a titanium layer 154$a$. Titanium nitride has a columnar crystalline structure. In the columnar crystalline structure, it is difficult to achieve a dense structure. Accordingly, the Cu barrier property of titanium nitride is low. In addition, it cannot be said that the Cu barrier property of titanium is sufficiently high. Therefore, copper in the plug 105 is diffused into the pixel electrode 154, and is also diffused inside the pixel electrode 154. Although it is necessary to wait for future studies about the detail, it is considered that exposure of the surface of the pixel electrode 154 to oxygen plasma facilitates diffusion of copper from the plug 105 into the pixel electrode 154, and diffusion of copper inside the pixel electrode 154.

When the top surface of the pixel electrode 154 is exposed to the ashing gas, that is, oxygen in the state where copper has been diffused into the top surface of the pixel electrode 154, copper is abnormally oxidized. In this way, as schematically illustrated in FIG. 7A, lumps 155 of copper oxide can be formed on the top surface of the pixel electrode 154. The lumps 155 each have, for example, a substantially semispherical shape. Once the lumps 155 of copper oxide are formed, various failures can occur.

For example, after the ashing, as illustrated in FIG. 7B, the photoelectric conversion film 107 is formed on the pixel electrodes 154 and the lumps 155. Copper atoms in the lumps 155 are diffused into the photoelectric conversion film 107, and act as trap level, which can deteriorate the leakage characteristics of the photoelectric conversion film 107. Specifically, leak paths for current are formed in the photoelectric conversion film 107, so that leak current is likely to flow. In addition, once copper atoms are diffused into the photoelectric conversion film 107, the sensitivity and the reliability of the photoelectric conversion film 107 deteriorate.

The pixel electrode of Japanese Unexamined Patent Application Publication No. 3-171769 has a TiN/Ti structure. The aforementioned problem can occur in the process of manufacturing an imaging device in which a plug containing copper is connected to this pixel electrode.

In contrast, in the present embodiment, the pixel electrode 104 contains tantalum nitride. Tantalum nitride has an amorphous crystalline structure, and it is thus easy to achieve a dense structure. Accordingly, the Cu barrier property of tantalum nitride is high. Therefore, in the pixel electrode 104 of the present embodiment, a situation where copper from the plug 105 is diffused into the top surface of the pixel electrode 104 is less likely to occur. Thus, a situation where lumps of copper oxide are formed on the top surface of the pixel electrode 104 is less likely to occur. This can suppress deterioration of the leakage characteristics of the photoelectric conversion film 107, and thus suppress decreases in sensitivity and reliability of the photoelectric conversion film 107.

In addition, in the present embodiment, the connection electrode 103 contains tantalum nitride. Accordingly, in the connection electrode 103 of the present embodiment, a situation where copper from the plug 106 is diffused into the top surface of the connection electrode 103 is less likely to occur. Therefore, a situation where lumps of copper oxide are formed on the top surface of the connection electrode 103 is less likely to occur. Thus, a situation where the connection between the connection electrode 103 and the counter electrode 108 in the counter electrode region is hindered by a lump of copper oxide is less likely to be caused. In addition, a situation where electrical resistance in the electric paths to the counter electrode 108 is increased by a lump of copper oxide is less likely to be caused.

Hereinafter, other embodiments are described. In the following description, elements common to the embodiment described above and embodiment to be described below are denoted by the same reference signs, and the description thereof is sometimes omitted. The descriptions regarding the respective embodiments may be applied to each other unless such application causes technical contradiction. The embodiments may be combined with each other unless such combination causes technical contradiction.

Second Embodiment

Figure 8A:
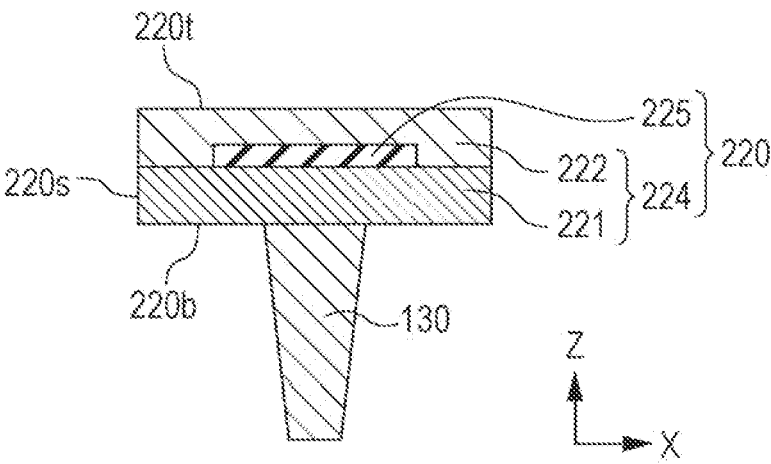
FIG. 8A is a schematic sectional view illustrating a configuration of a second electrode.
Figure 8B:
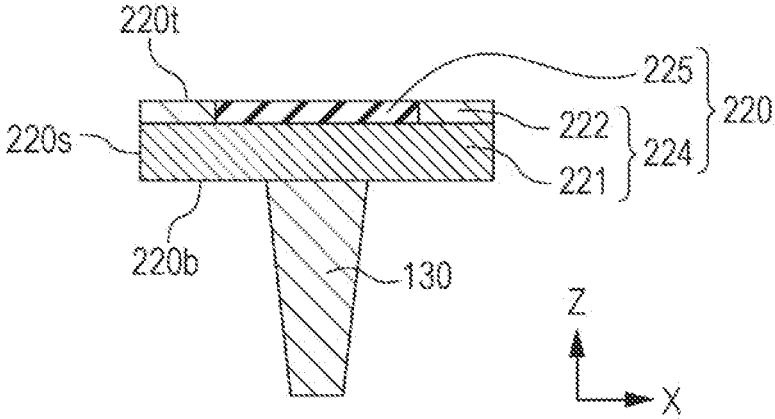
FIG. 8B is a schematic sectional view illustrating the configuration of the second electrode.

A second embodiment uses an electrode having an insulating film. Hereinafter the second embodiment is described.
2-3. Configuration and the Like of the Electrode FIGS. 8A and 8B are schematic sectional views illustrating configurations of a second electrode 220 of the present embodiment. In the examples of FIGS. 8A and 8B, the second electrode 220 is connected to a plug 130. Specifically, a bottom surface 220b of the second electrode 220 is connected to the plug 130.

In the examples of FIGS. 8A and 8B, the second electrode 220 has an electrode body 224 and an insulating film 225. The electrode body 224 secures electric paths in the second electrode 220. The insulating film 225 has a high density. Accordingly, in the second electrode 220, diffusion of a metal derived from outside the second electrode 220 can be suppressed by the insulating film 225. In other words, in the second electrode 220, the insulating film 225 can exert metal barrier property against a metal derived from outside the second electrode 220. For example, the second electrode 220 has a Cu barrier property based on the insulating film 225.

In the examples of FIGS. 8A and 8B, the conductivity of the electrode body 224 is higher than the conductivity of the insulating film 225.

In the example of FIG. 8A, the insulating film 225 is surrounded by the electrode body 224 from above, below, and side. In this context, "surround" specifically means to surround with no gap. More specifically, the entire surface of the insulating film 225 is in contact with the electrode body 224.

In the example of FIG. 8B, the insulating film 225 forms part of a top surface of the second electrode 220. On the other hand, the insulating film 225 is not exposed at a bottom surface of the second electrode 220.

The insulating film 225 does not have to be exposed at the top surface of the second electrode 220, while the insulating film 225 may form part of the bottom surface of the second electrode 220.

In the examples of FIGS. 8A and 8B, at least part of the top surface 220t of the second electrode 220 is formed of the electrode body 224. At least part of the bottom surface 220b of the second electrode 220 is formed of the electrode body 224. This configuration makes it possible to secure electric paths from the bottom surface 220b to the top surface 220t of the second electrode 220.

In the example of FIG. 8A, specifically, the entirety of the top surface 220t of the second electrode 220 is formed of the electrode body 224. The entirety of the bottom surface 220b of the second electrode 220 is formed of the electrode body 224.

In the example of FIG. 8B, specifically, only part of the top surface 220t of the second electrode 220 is formed of the electrode body 224. The entirety of the bottom surface 220b of the second electrode 220 is formed of the electrode body 224.

However, the entirety of the top surface 220t of the second electrode 220 may be formed of the electrode body 224, while only part of the bottom surface 220b of the second electrode 220 may be formed of the electrode body 224. In addition, only part of the top surface 220t of the second electrode 220 may be formed of the electrode body 224, while only part of the bottom surface 220b of the second electrode 220 may be formed of the electrode body 224.

In the examples of FIGS. 8A and 8B, the electrode body 224 includes a first layer 221 and a second layer 222. In the examples of FIGS. 8A and 8B, the second layer 222 is on the first layer 221. The electrode body 224 may have a layer other than the first layer 221 and the second layer 222.

In the examples of FIGS. 8A and 8B, at least part of the top surface 220t of the second electrode 220 is formed of the second layer 222. At least part of the bottom surface 220b of the second electrode 220 is formed of the first layer 221.

In the example of FIG. 8A, specifically, the entirety of the top surface 220t of the second electrode 220 is formed of the second layer 222. The entirety of the bottom surface 220b of the second electrode 220 is formed of the first layer 221.

In the example of FIG. 8B, specifically, only part of the top surface 220t of the second electrode 220 is formed of the second layer 222. The entirety of the bottom surface 220b of the second electrode 220 is formed of the first layer 221.

However, the entirety of the top surface 220t of the second electrode 220 may be formed of the second layer 222, while only part of the bottom surface 220b of the second electrode 220 may be formed of the first layer 221. In addition, only part of the top surface 220t of the second electrode 220 may be formed of the second layer 222, while only part of the bottom surface 220b of the second electrode 220 may be formed of the first layer 221.

In the examples of FIGS. 8A and 8B, at least part of a side surface 220s of the second electrode 220 is formed of the electrode body 224. Specifically, the entirety of the side surface 220s of the second electrode 220 is formed of the electrode body 224. However, only part of the side surface 220s of the second electrode 220 may be formed of the electrode body 224. Note that the side surface 220s is a surface connecting the top surface 220t and the bottom surface 220b.

Figure 9:
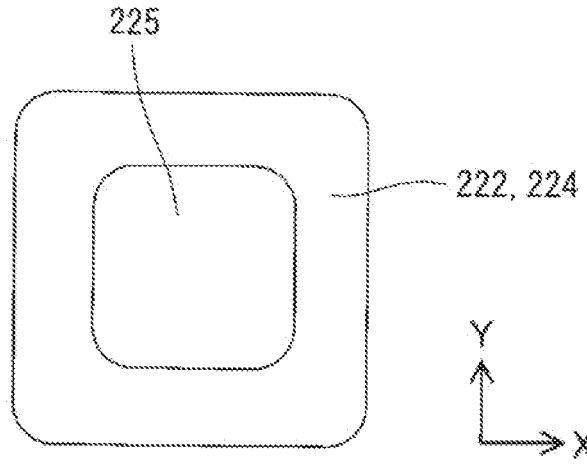
FIG. 9 is a schematic sectional view illustrating the configuration of a second electrode.

FIG. 9 is a schematic sectional view illustrating a configuration of a second electrode 220 according to an example. In the examples of FIGS. 8A and 8B, the electrode body 224 and the insulating film 225 appear in a cross-section perpendicular to the top-bottom direction as illustrated in FIG. 9. Specifically, in the cross-section perpendicular to the top-bottom direction, the insulating film 225 is surrounded by the electrode body 224. In the second electrode 220 according to this example, it is possible to achieve suppression of diffusion of a metal derived from outside the second electrode 220 while suppressing an increase in resistance value of the second electrode 220. More specifically, in the cross-section perpendicular to the top-bottom direction, the insulating film 225 is surrounded by the second layer 222. However, in the cross-section perpendicular to the top-bottom direction, the insulating film 225 does not have to be surrounded by the first layer 221. Note that in this context, "surround" specifically means to surround with no gap.

In the examples of FIGS. 8A and 8B, the first layer 221 is disposed between the plug 130 and the insulating film 225. The insulating film 225 contains an oxide. The first layer 221 contains a non-oxide. In this example, the insulation property of the insulating film 225 can be ensured by the oxide. On the other hand, in the plug 130, a metal is less likely to react with the oxide derived from the insulating film 225. This is advantageous from the viewpoint of suppressing deterioration of the properties of the plug 130. Examples of the non-oxide include metals, metal nitrides, and the like. Specifically, the insulating film 225 contains an oxide as a main component. The first layer 221 contains a non-oxide as a main component.

Figure 10A:
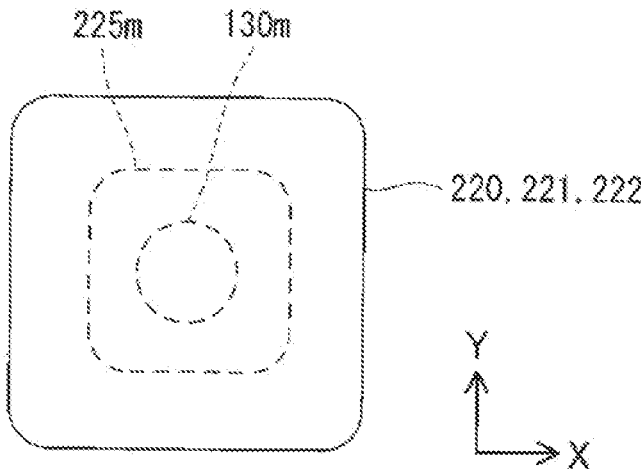
FIG. 10A is a schematic top view illustrating the configuration of the second electrode.
Figure 10B:
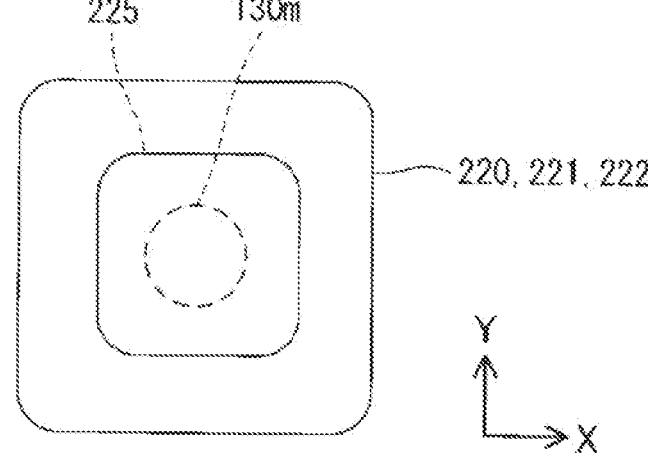
FIG. 10B is a schematic top view illustrating the configuration of the second electrode.

FIGS. 10A and 10B are schematic top views illustrating configurations of the second electrode 220. In the examples of FIGS. 8A and 8B, when viewed from above, at least part of the insulating film 225 and at least part of a connection surface 130m of the plug 130 with the second electrode 220 overlap each other, as illustrated in FIGS. 10A and 10B, respectively. This configuration makes it easy to suppress diffusion of a metal derived from the plug 130 in the second electrode 220.

In the configurations of FIGS. 10A and 10B, specifically, when viewed from above, the entirety of the connection surface 130m of the plug 130 with the second electrode 220 overlaps the insulating film 225. In the configurations of FIGS. 10A and 10B, more specifically, when viewed from above, the entirety of a contour 225m of the insulating film 225 is located outside the connection surface 130m. However, when viewed from above, only part of the connection surface 130m of the plug 130 with the second electrode 220 may overlap the insulating film 225.

Note that in FIGS. 10A and 10B, the position of the contour of the connection surface 130m of the plug 130 with the second electrode 220 is indicated by a dotted line. In addition, in FIG. 10A, the position of the contour 225m of the insulating film 225 is indicated by a dotted line.

As described above, in the examples of FIGS. 8A and 8B, the second layer 222 forms at least part of the top surface 220t of the second electrode 220. This makes it possible to impart desired properties to the top surface 220t of the second electrode 220 by using the second layer 222. Specifically, in the example of FIG. 8A, the second layer 222 forms the entirety of the top surface 220t of the second electrode 220. In the example of FIG. 8B, the second layer 222 forms only part of the top surface 220t of the second electrode 220.

For example, it is possible to impart conductivity and chemical stability to the top surface 220t of the second electrode 220 by employing a layer containing titanium nitride as the second layer 222. In addition, assume that the first electrode contains ITO. In this case, it is possible to make the work function of the material contained in the first electrode and the work function of the material contained in second layer 222 close to each other by employing a layer containing titanium nitride as the second layer 222. The second layer 222 may contain titanium nitride as a main component.

In the example of FIG. 8A, the insulating film 225 is located between the first layer 221 and the second layer 222. Specifically, the insulating film 225 is located between the first layer 221 and the second layer 222 in the top-bottom direction. The second electrode 220 according to this example can be fabricated through a manufacturing process including providing the first layer 221, the insulating film 225, and the second layer 222 in this order. In this case, the density of the insulating film 225 makes it easy to ensure the stability of the top surface of the first layer 221 located under the insulating film 225. In addition, it is made easy to stabilize the crystallinity of the second layer 222 located on the insulating film 225.

In the example of FIG. 8B, when viewed from above, the second layer 222 has a frame shape. When viewed from above, the insulating film 225 is disposed inside the frame-shaped body.

In the examples of FIGS. 8A and 8B, the insulating film 225 enters only the second layer 222. However, the insulating film 225 may enter only the first layer 221. In addition, the insulating film 225 may enter both of the first layer 221 and the second layer 222.

In the examples of FIGS. 8A and 8B, when viewed from above, the outer peripheral ends of the respective layers of the electrode body 224 of the second electrode 220 coincide with each other over the entire periphery as illustrated in FIGS. 10A and 10B, respectively.

In the examples of FIGS. 8A and 8B, the thickness of the insulating film 225 is greater than or equal to 10 nm. When the insulating film 225 is thick to this extent, it is easy to ensure the above-described action of suppressing diffusion, that is, the metal barrier property. The thickness of the insulating film 225 may be greater than or equal to 15 nm.

The thickness of the insulating film 225 is, for example, less than or equal to 70 nm. The thickness of the insulating film 225 may be less than or equal to 50 nm, or may be less than or equal to 40 nm.

The insulating film 225 may be thinner than the first layer 221. The thickness of the insulating film 225 may be equal to the thickness of the first layer 221. The insulating film 225 may be thicker than the first layer 221.

The structure of the insulating film 225 may be a single-layer structure, or may be a multilayer structure.

Examples of the insulating material that may be contained in the insulating film 225 include silicon oxide, silicon nitride, alumina (ALO), tetraethoxysilane (TEOS), and the like. The insulating film 225 may contain one material selected from these as a main component.

In the examples of FIGS. 8A and 8B, the metal of the plug 130 is in contact with the second electrode 220. Specifically, the copper of the plug 130 is in contact with the second electrode 220. In addition, specifically, the metal of the plug 130 is in contact with the bottom surface 220*b* of the second electrode 220.

The thickness of the first layer 221 is, for example, 5 to 70 nm. The thickness of the first layer 221 may be 10 to 60 nm, or may be 10 to 40 nm.

The thickness of the second layer 222 is, for example, 25 to 90 nm. The thickness of the second layer 222 may be 30 to 90 nm, or may be 30 to 70 nm.

Examples of the material that may be contained in the electrode body 224 include metals, metal nitrides, and the like. Examples of the metals include titanium (Ti), tantalum (Ta), aluminum (Al), tungsten (W), and the like. Examples of the metal nitrides include tantalum nitride (TaN), titanium nitride (TiN), and the like. The electrode body 224 may contain one material selected from these as a main component.

The material that may be contained in the first layer 221 is similar to the material that may be contained in the electrode body 224. The material that may be contained in the second layer 222 is similar to the material that may be contained in the electrode body 224. The material that is contained in the first layer 221 may be the same as or may be different from, the material that is contained in the second layer 222.

Specific examples of the configurations which the second electrode 220 of FIGS. 8A and 8B can take are as follows.

In the second electrodes 220 of FIGS. 8A and 8B, the first layer 221 containing tantalum as a main component and the second layer 222 containing tantalum nitride as a main component are stacked in this order from bottom to top.

In the second electrodes 220 of FIGS. 8A and 8B, the first layer 221 containing titanium as a main component and the second layer 222 containing titanium nitride as a main component may be stacked in this order from bottom to top.

In the second electrodes 220 of FIGS. 8A and 8B, the first layer 221 containing tantalum nitride as a main component and the second layer 222 containing titanium nitride as a main component may be stacked in this order from bottom to top.

The specific configuration of the second electrode 220 is not limited to the configurations illustrated in FIGS. 8A and 8B. For example, a configuration of a stacked body of a first shaped body 228, an insulating film 225, and a second shaped body 229 illustrated in FIG. 11D can be considered as a configuration which the second electrode 220 may have.

The insulating film 225 makes it possible to exert the metal barrier property. For this reason, the configuration of the second electrode 220 may be employed in an electrode that is located at a position where the metal barrier property is particularly required. In a specific example, the pixel electrode 104 does not have an insulating film, while the connection electrode 103 has the configuration of the second electrode 220. However, it is possible that the pixel electrode 104 has the configuration of the second electrode 220 while the connection electrode 103 does not have an insulating film. In addition, both of the pixel electrode 104 and the connection electrode 103 may have the configuration of the second electrode 220.

The following configuration may also be employed. That is, a plurality of the second electrodes 220 are present. The plurality of second electrodes 220 include a third electrode and a fourth electrode. The insulating film 225 of the third electrode is thicker than the insulating film 225 of the fourth electrode. Such a configuration makes it easy to make the metal barrier property of the third electrode higher than the metal barrier property of the fourth electrode.

The third electrode corresponds, for example, to the connection electrode 103. The fourth electrode corresponds, for example, to the pixel electrode 104.

The thickness of the insulating film 225 of the third electrode may be equal to the thickness of the insulating film 225 of the fourth electrode. The insulating film 225 of the third electrode may be thinner than the insulating film 225 of the fourth electrode.

The first layer 221 of the third electrode may be thicker than the first layer 221 of the fourth electrode. The thickness of the first layer 221 of the third electrode may be equal to the thickness of the first layer 221 of the fourth electrode. The first layer 221 of the third electrode may be thinner than the first layer 221 of the fourth electrode.

The second layer 222 of the third electrode may be thicker than the second layer 222 of the fourth electrode. The thickness of the second layer 222 of the third electrode may be equal to the thickness of the second layer 222 of the fourth electrode. The second layer 222 of the third electrode may be thinner than the second layer 222 of the fourth electrode.

2-4-1. Method For Manufacturing Imaging Device

Figure 11A:
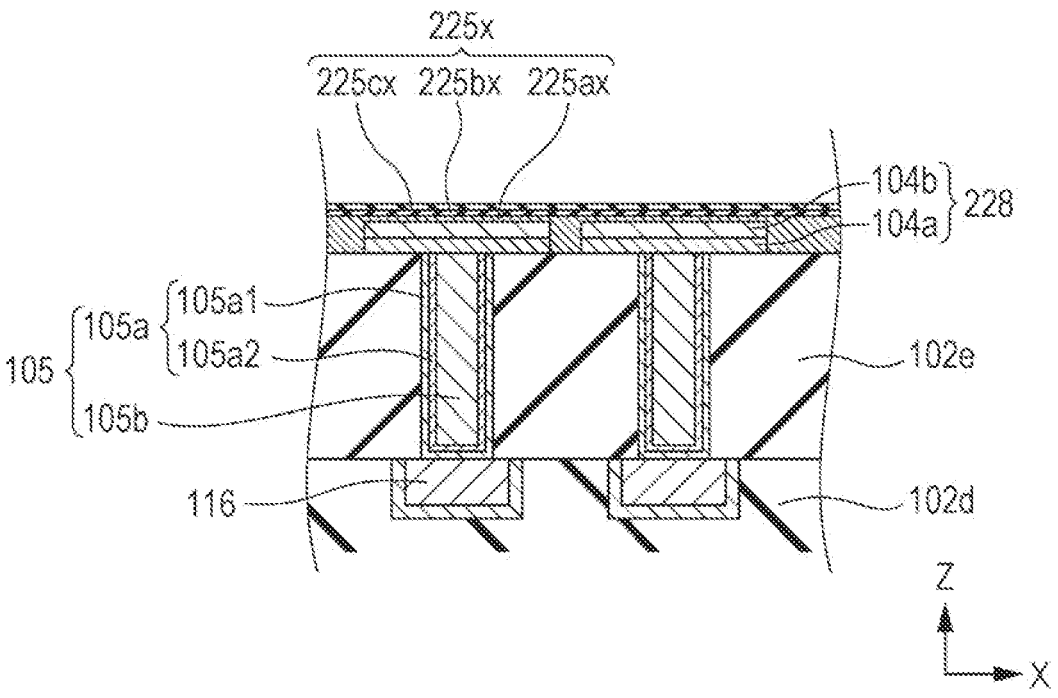
FIG. 11A is a schematic process view illustrating part of a process of manufacturing the imaging device.
Figure 11B:
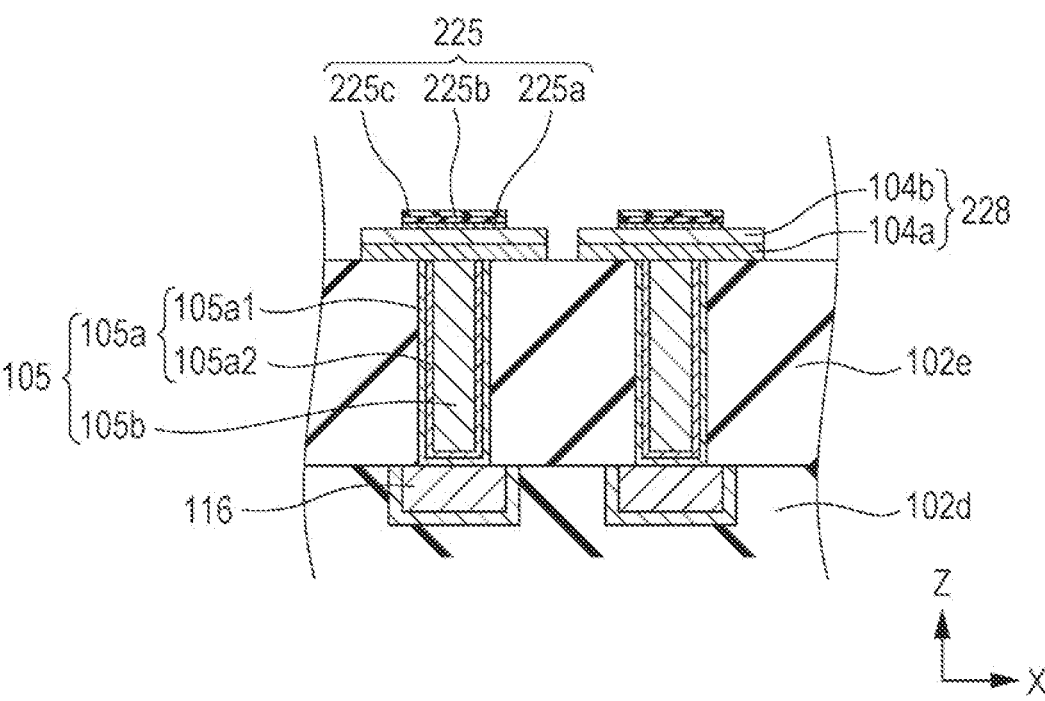
FIG. 11B is a schematic process view illustrating part of the process of manufacturing the imaging device.
Figure 11C:
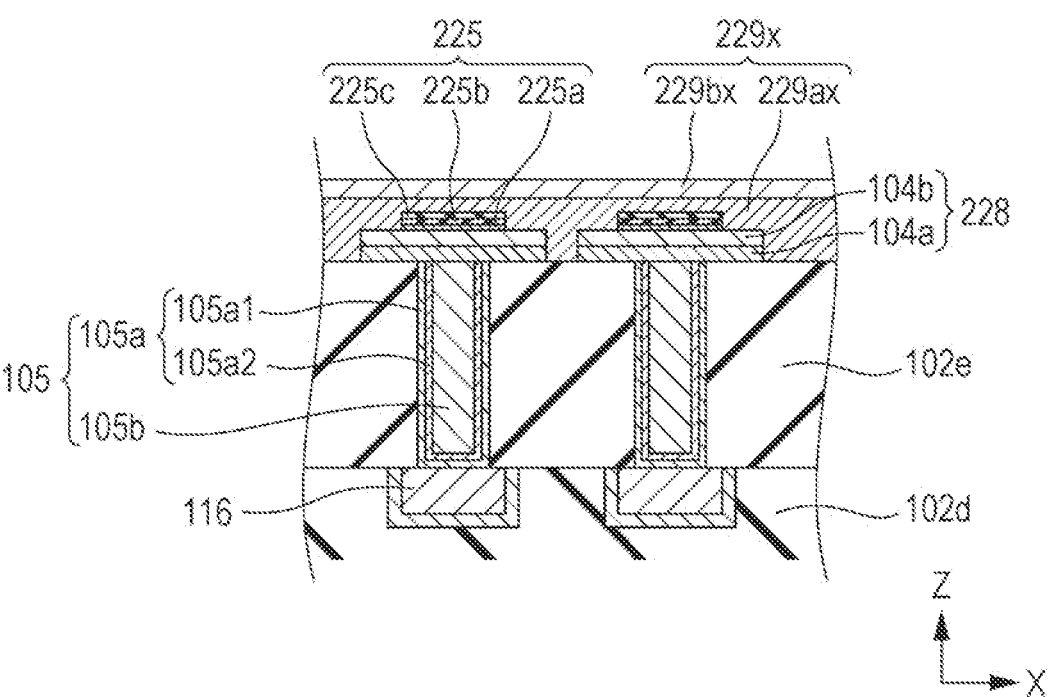
FIG. 11C is a schematic process view illustrating part of the process of manufacturing the imaging device.
Figure 11D:
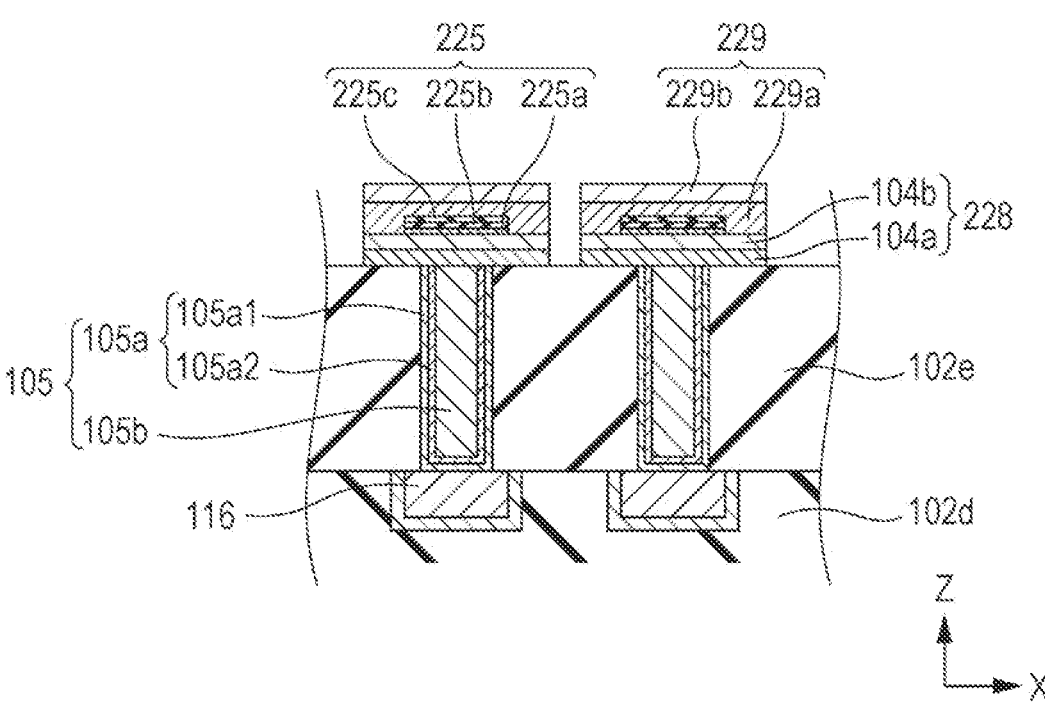
FIG. 11D is a schematic process view illustrating part of the process of manufacturing the imaging device.

Hereinafter, an example of the method for manufacturing the imaging device 1 according to the present embodiment is described. FIGS. 11A to 11C are each a schematic process view illustrating part of the process of manufacturing the imaging device 1. Note that in the following description, steps and the like regarding the formation of the pixel electrode 104 are described, and description of the other steps is omitted.

The structure illustrated in FIG. 6F is fabricated in accordance with the description in "1-4. Method for Manufacturing Imaging device 1" of the first embodiment.

At this stage, what is referred to as the pixel electrode 104 in the first embodiment is formed. In the present embodiment, what is referred to as the pixel electrode 104 in the first embodiment is expressed as a first shaped body 228.

On the structure of FIG. 6F, alumina, silicon nitride, and silicon oxide are sequentially deposited by the CVD method or the physical vapor deposition (PVD) method. In this way, a stacked body 225*x* is formed on the first shaped body 228 and the configuration layer 102*e*, so that a structure illustrated in FIG. 11A is obtained. In the stacked body 225*x*, a layer 225*ax* containing alumina, a layer 225*bx* containing silicon nitride, and a layer 225*cx* containing silicon oxide are stacked in this order from bottom to top. The stacked body 225*x* spreads over a plurality of plugs 105 when viewed from above.

Next, a third resist pattern is formed on the stacked body 225*x* by the lithography method. Illustration of the third resist pattern is omitted.

Next, the stacked body 225*x* is etched by dry etching with the third resist pattern as a mask. This divides the stacked body 225*x* into a plurality of pieces. In this way, a structure illustrated in FIG. 11B in which one insulating film 225 is formed on each first shaped body 228 is obtained. In the insulating film 225, a layer 225*a* containing alumina, a layer 225*b* containing silicon nitride, and a layer 225*c* containing silicon oxide are stacked in this order from bottom to top.

Next, on the structure of FIG. 11B, tantalum nitride and titanium nitride are sequentially deposited by the CVD method or the physical vapor deposition (PVD) method. In this way, a stacked body 229*x* is formed on the insulating film 225, the first shaped body 228, and the configuration layer 102*e*, so that a structure illustrated in FIG. 11C is obtained. The stacked body 229*x* includes a lower layer 229*ax* containing tantalum nitride and an upper layer 229*bx* containing titanium nitride. The total film thickness of a portion on the insulating film 225 in the stacked body 229x is, for example, 50 nm. The stacked body 229x spreads over the plurality of plugs 105 when viewed from above.

Next, a second resist pattern having a pixel electrode pattern is formed on the stacked body 229x by the lithography method. Illustration of the second resist pattern is omitted.

Next, the stacked body 229x is etched by dry etching with the second resist pattern as a mask. This divides the stacked body 229x into a plurality of pieces. In this way, a structure illustrated in FIG. 11D in which a second shaped body 229 is formed on the insulating film 225 and the first shaped body 228 is obtained. The second shaped body 229 includes a lower layer 229a containing tantalum nitride and an upper layer 229b containing titanium nitride. In this structure, the first shaped body 228, the insulating film 225, and the second shaped body 229 form the pixel electrode 104 of the second embodiment. In this structure, a plurality of the pixel electrodes 104 are present. The plurality of pixel electrodes 104 are separate from each other, and each pixel electrode 104 is connected to the corresponding one plug 105. The pixel electrodes 104 are etched from above in a later step, so that the top surfaces are planarized.

The lower layer 104a of the first shaped body 228 may correspond to the first layer 221. The upper layer 104b of the first shaped body 228 may correspond to the first layer 221. The lower layer 229a of the second shaped body 229 may correspond to the second layer 222. The upper layer 229b of the second shaped body 229 may correspond to the second layer 222.

2-4-2. Method For Manufacturing Imaging Device

Hereinafter, another example of the method for manufacturing the imaging device 1 according to the present embodiment is described. FIGS. 12A to 12D are each a schematic process view illustrating part of the process of manufacturing the imaging device 1. Note that in the following description, steps and the like regarding the formation of the pixel electrode 104 are described, and description of the other steps is omitted.

The structure illustrated in FIG. 6D is fabricated in accordance with the description in "1-4. Method for Manufacturing Imaging device 1" of the first embodiment.

Figure 12A:
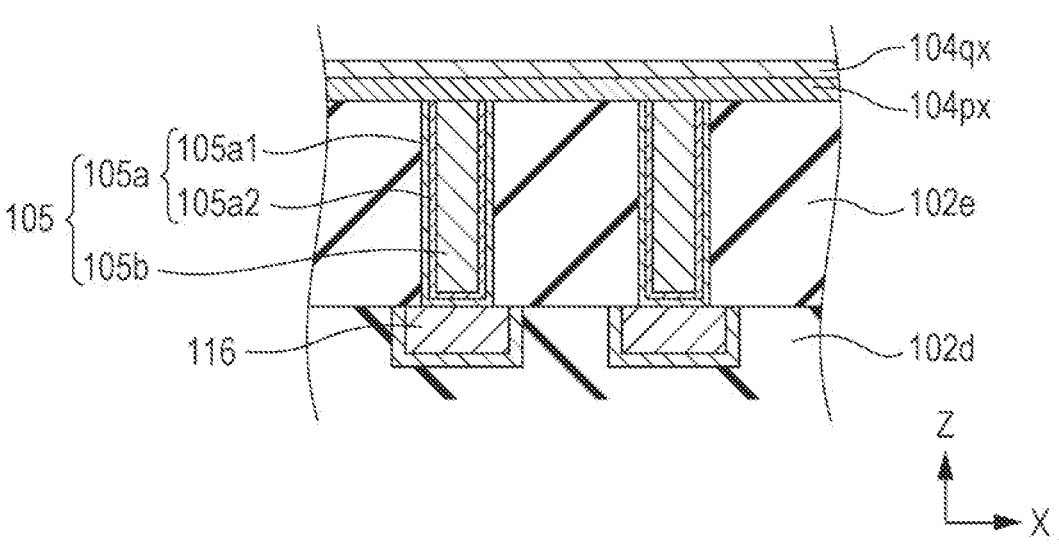
FIG. 12A is a schematic process view illustrating part of a process of manufacturing the imaging device.

On the structure of FIG. 6D, titanium (Ti) and tetraethoxysilane (TEOS) are sequentially deposited by the CVD method or the physical vapor deposition (PVD) method. In this way, a lower layer 104px is formed on the plug 105 and the configuration layer 102e, and an intermediate layer 104qx is formed on the lower layer 104px. In this way, a structure illustrated in FIG. 12A is obtained. The lower layer 104px contains titanium. The intermediate layer 104qx contains tetraethoxysilane. The lower layer 104px and the intermediate layer 104qx spread over the plurality of plug 105 when viewed from above.

Next, a third resist pattern is formed on the intermediate layer 104qx by the lithography method. Illustration of the third resist pattern is omitted.

Next, the intermediate layer 104qx is etched by dry etching with the third resist pattern as a mask. This divides the intermediate layer 104qx into a plurality of pieces. In this way, a structure illustrated in FIG. 12B in which a plurality of insulating films 225 are formed on the lower layer 104px is obtained.

Figure 12B:
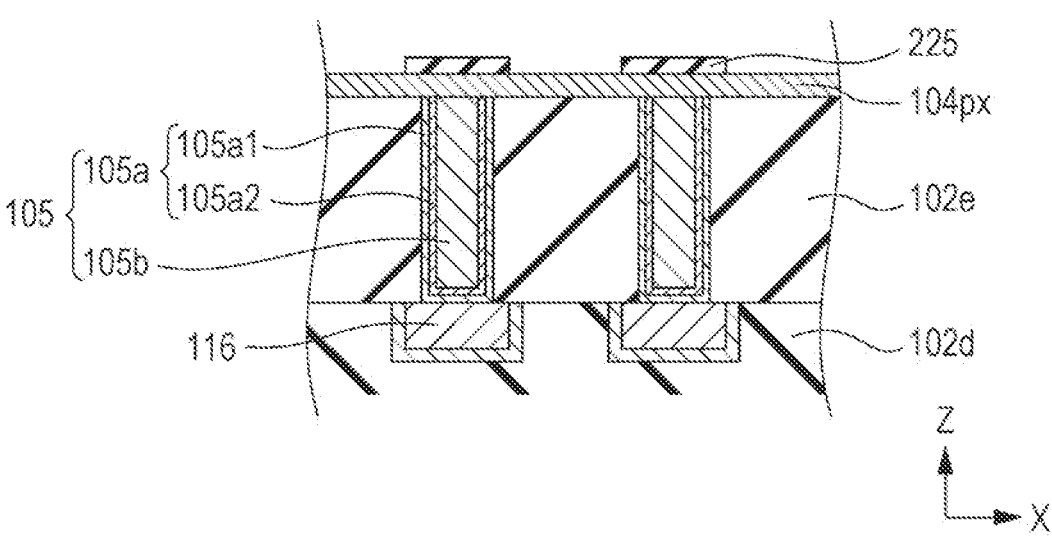
FIG. 12B is a schematic process view illustrating part of the process of manufacturing the imaging device.
Figure 12C:
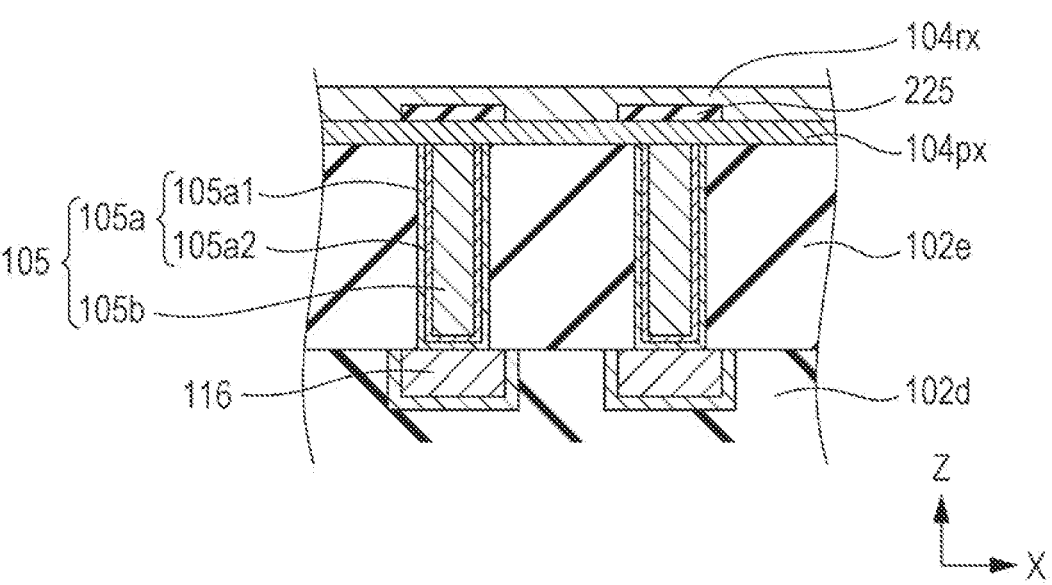
FIG. 12C is a schematic process view illustrating part of the process of manufacturing the imaging device.

Next, on the structure of the FIG. 12B, titanium nitride (TiN) is deposited by the CVD method or the physical vapor deposition (PVD) method. In this way, an upper layer 104rx is formed on the lower layer 104px and the insulating film 225, so that a structure illustrated in FIG. 12C is obtained. The upper layer 104rx contains titanium nitride. The upper layer 104rx spreads over the plurality of plugs 105 when viewed from above.

Next, a second resist pattern having a pixel electrode pattern is formed on the upper layer 104rx by the lithography method. Illustration of the second resist pattern is omitted.

Figure 12D:
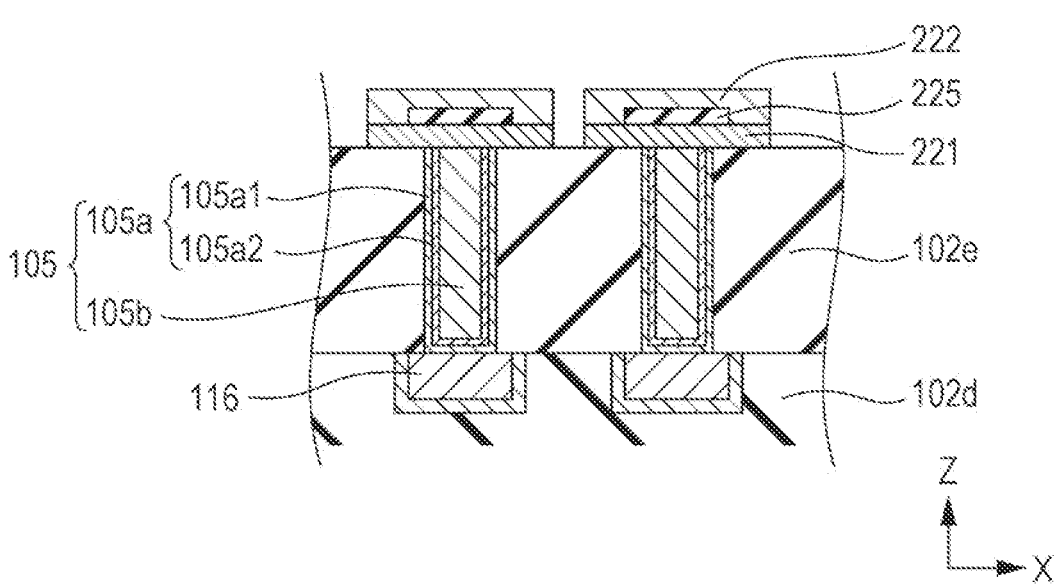
FIG. 12D is a schematic process view illustrating part of the process of manufacturing the imaging device.

Next, the lower layer 104px and the upper layer 104rx are etched by dry etching with the second resist pattern as a mask. This divides a combination of the lower layer 104px, the plurality of insulating films 225, and the upper layer 104rx into a plurality of pieces. In this way, a plurality of pixel electrodes 104 as illustrated in FIG. 12D are formed. In each pixel electrode 104, a second layer 222 is provided on a first layer 221, and the insulating film 225 is disposed between these first layer 221 and second layer 222. The first layer 221 contains titanium. The second layer 222 contains titanium nitride. The plurality of pixel electrodes 104 are separate from each other, and each pixel electrode 104 is connected to the corresponding one plug 105. The pixel electrodes 104 are etched from above in a later step, so that the top surfaces are planarized.

Third Embodiment

In a third embodiment, an example of the method for manufacturing the imaging device 1 that can be applied to the first embodiment and the second embodiment is described. FIGS. 13A to 13E are each a schematic process view illustrating part of the process of manufacturing the imaging device 1. In the following description, steps and the like of forming a photoelectric conversion film by etching are described, and description of the other steps is omitted.

3-4. Method For Manufacturing Imaging device

Figure 13A:
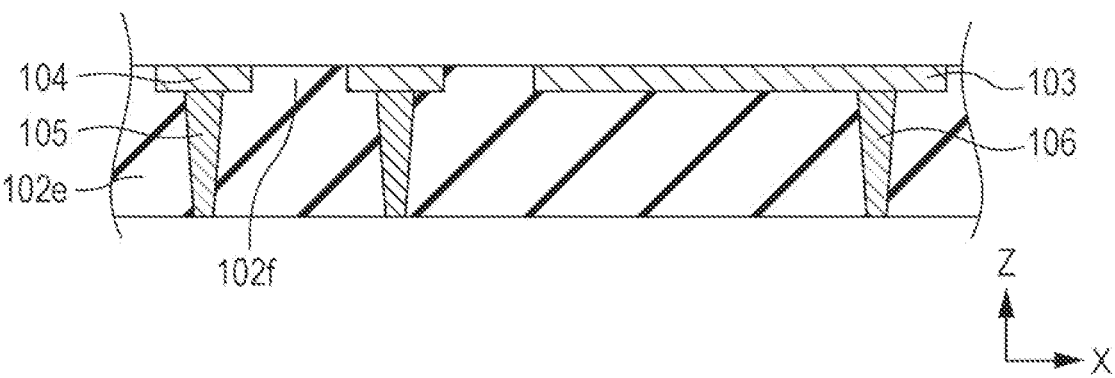
FIG. 13A is a schematic process view illustrating part of a process of manufacturing the imaging device.

A structure in which a pixel electrode 104, a configuration layer 102f, and a connection electrode 103 form a top surface as illustrated in FIG. 13A is formed. In this structure, a plug 105 is connected to a bottom surface of the pixel electrode 104. A plug 106 is connected to a bottom surface of the connection electrode 103. These plugs 105 and 106 penetrate a configuration layer 102e.

A layer 107x is deposited on the structure of FIG. 13A. The layer 107x can be formed by the spin coating method, the inkjet method, the die coating method, the spray coating method, the vacuum deposition method, the screen printing method, or the like. The layer 107x is patterned into a predetermined shape in a later step to become a photoelectric conversion film 107. The material of the layer 107x may be determined as appropriate depending on the material of the photoelectric conversion film 107 to be obtained.

Next, a layer 108x is formed on the layer 107x. The layer 108x is formed by, for example, sputtering. The layer 108x is patterned into a predetermined shape in a later step to become a counter electrode 108. The material of the layer 108x can be determined as appropriate depending on the material of the counter electrode 108 to be obtained.

Next, a layer 109x is formed on the layer 108x. The layer 109x can be formed by, for example, the atomic layer deposition (ALD) method, the chemical vapor deposition (CVD) method, the sputtering method, or the like. The layer 109x is patterned into a predetermined shape in a later step to become a buffer layer 109. The material of the layer 109x can be determined as appropriate depending on the material of the buffer layer 109 to be obtained.

Figure 13B:
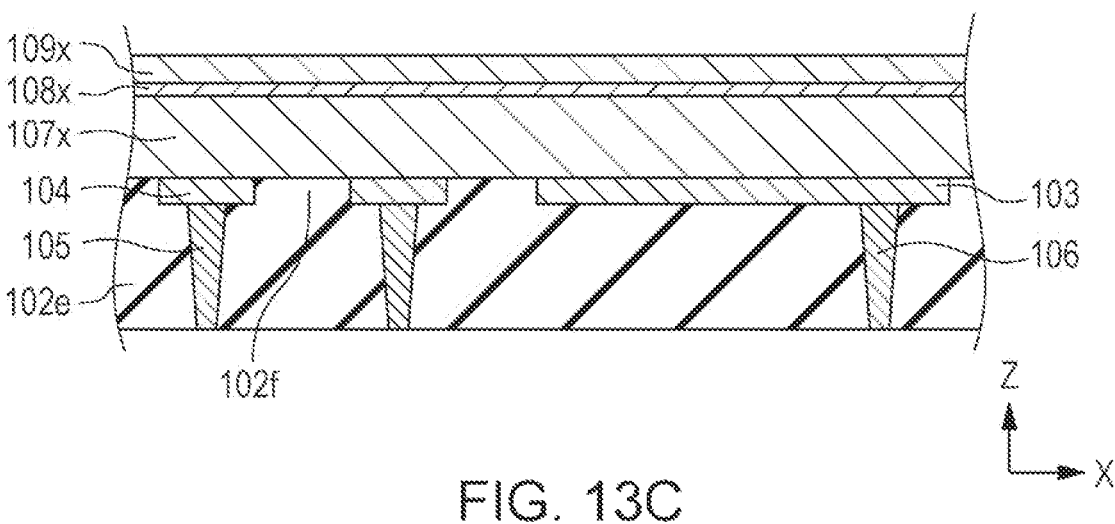
FIG. 13B is a schematic process view illustrating part of the process of manufacturing the imaging device.

A structure in which the layer 107x, the layer 108x, and the layer 109x are formed is illustrated in FIG. 13B.

Next, a photoresist is applied onto the layer 109x, and the photoresist 195 thus applied is left only in a portion corresponding to the photoelectric conversion film 107 to be obtained later by using the photolithography, or the like.

Figure 13C:
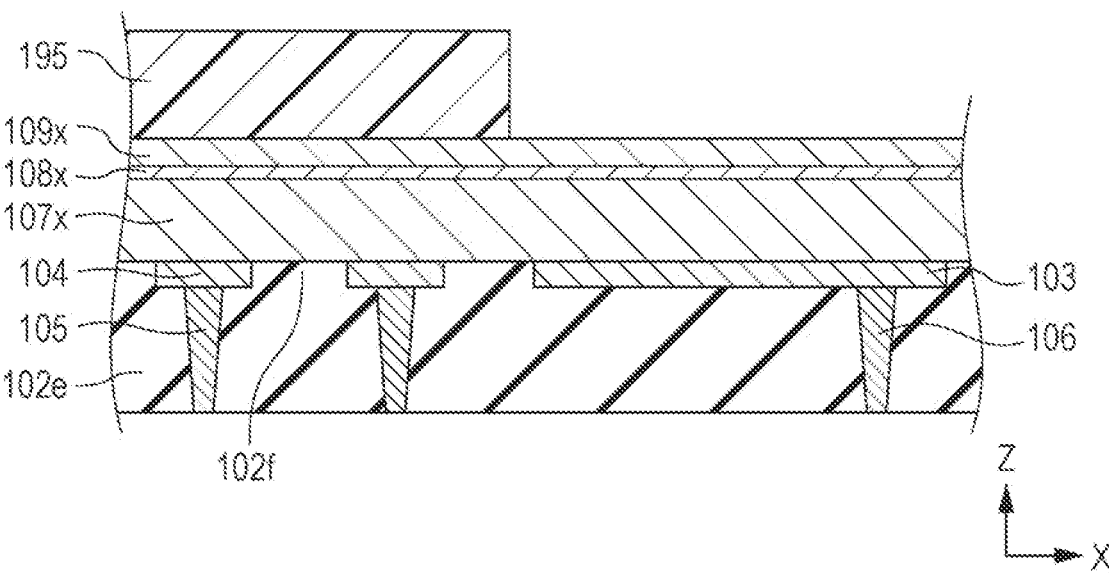
FIG. 13C is a schematic process view illustrating part of the process of manufacturing the imaging device.

A structure in which the photoresist 195 is formed is illustrated in FIG. 13C.

Next, a portion which is not covered by the photoresist 195 in the layer 107x, the layer 108x, and the layer 109x is removed by etching. In this way, the photoelectric conversion film 107, the counter electrode 108, and the buffer layer 109 patterned into predetermined shapes are formed.

In the present embodiment, the etching of the layer 107x, the layer 108x, and the layer 109x is performed by dry etching.

In the etching of the layer 108x and the layer 109x, the photoresist 195 is used as a mask. The etching of the layer 108x and the layer 109x is performed by using a gas containing halogens such as fluorine, chlorine, bromine, and iodine. In this event, it is possible to perform the patterning at a high precision by using a gas containing at least one element of fluorine or chlorine. In addition, the dry etching is performed by turning the gas into plasma through plasma discharging, and using reactive-ion etching (RIE) where the chemical species of the plasma gas reacts with the layer 108x and the layer 109x. In the case where the layer 108x and the layer 109x are formed by using a material containing nitrogen or silicon, the layer 108x and the layer 109x can be efficiently etched by using these gas and etching method.

The counter electrode 108 and the buffer layer 109 are formed by etching the layer 108x and the layer 109x.

Figure 13D:
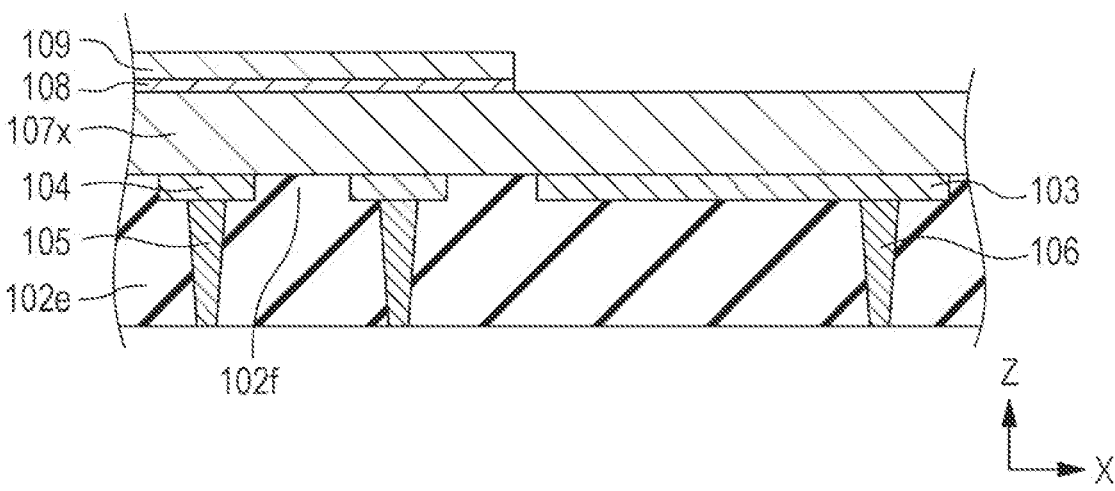
FIG. 13D is a schematic process view illustrating part of the process of manufacturing the imaging device.

A structure obtained by etching the layer 108x and the layer 109x is illustrated in FIG. 13D.

In the etching of the layer 107x, the buffer layer 109 is used as a mask. The material of the buffer layer 109 may be selected such that the buffer layer 109 can function as a mask. Examples of such a material include silicon oxynitride (SiON), and the like. The etching of the layer 107x is performed by using a gas containing oxygen. Specifically, a chamber is filled with a gas containing oxygen, and part of the layer 107x is oxidized by chemical etching through oxidation reaction. In the present embodiment, since the layer 107x contains a large amount of carbon, the layer 107x can be removed as carbon oxide through oxidation reaction with an oxygen gas.

Figure 13E:
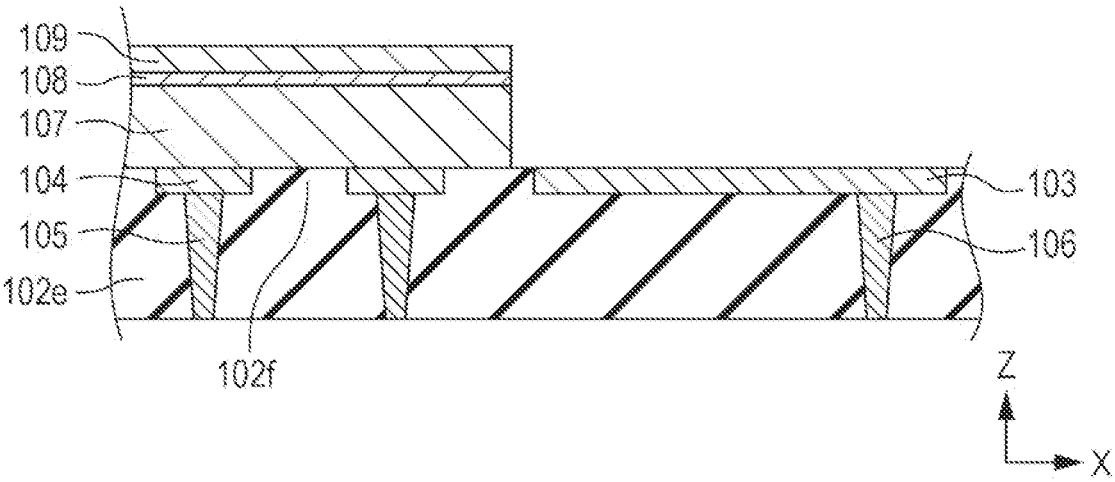
FIG. 13E is a schematic process view illustrating part of the process of manufacturing the imaging device.

The photoelectric conversion film 107 is formed by etching the layer 107x. A structure obtained by etching the layer 107x is illustrated in FIG. 13E.

Thereafter, an interconnection to electrically connect the counter electrode 108 and the connection electrode 103 is formed. This interconnection can be formed by an appropriate method. For example, the interconnection can be formed by providing a through-hole in the buffer layer 109, and connecting the top surface of the counter electrode 108 and the top surface of the connection electrode 103 through the through-hole. The through-hole can be formed by the photolithography and the etching. The interconnection can be formed by a combination of the sputtering, the vacuum deposition method, the etching, and the like. The interconnection can also be formed by connecting the side surface of the counter electrode 108 and the top surface of the connection electrode 103 without providing a through-hole. The interconnection may be provided by connecting the top surface of the counter electrode 108 and the top surface of the connection electrode 103 through a through-hole, and also connecting the side surface of the counter electrode 108 and the top surface of the connection electrode 103.

A specific example of how to etch the photoelectric conversion film, a specific example of how to electrically connect the counter electrode 108 and the connection electrode 103, and the like are described in, for example, International Publication No. WO 2019/239851.

3-5. Expression of Cu Barrier Property in Electrode

As described above, the method for manufacturing the imaging device 1 according to the third embodiment includes a step of forming a photoelectric conversion film 107 by etching the layer 107x using a gas containing oxygen. In this etching, the top surface of the connection electrode 103 is exposed to oxygen.

Figure 14:
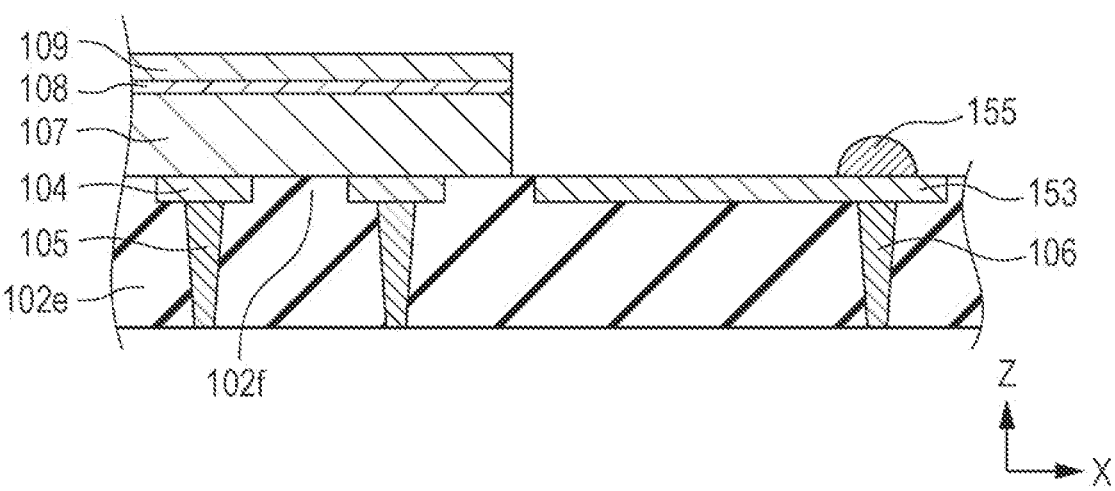
FIG. 14 is a schematic sectional view illustrating a state where copper has been abnormally oxidized.

Here, copper of the plug 106 can be diffused into the connection electrode 103. This diffusion can cause failures such as abnormal oxidation of copper. Hereinafter, the action of suppressing diffusion of copper into the pixel electrode 104, that is, the Cu barrier property is described. FIG. 14 is a schematic sectional view illustrating the state where copper has been abnormally oxidized.

Assume that the connection electrode 153 does not contain tantalum nitride or an insulating film but instead contains titanium nitride. As described in the first embodiment, the Cu barrier property of titanium nitride is low. For this reason, copper in the plug 106 is diffused into the connection electrode 153, and also diffused inside the connection electrode 153.

When the top surface of the connection electrode 153 is exposed to oxygen in the state where copper has been diffused into the top surface of the connection electrode 153, copper is abnormally oxidized. In this way, as schematically illustrated in FIG. 14, a lump 155 of copper oxide can be formed on the top surface of the connection electrode 153. The lump 155 has, for example, a substantially semispherical shape. Once the lump 155 of copper oxide is formed, various failures can occur.

For example, after the step of forming the photoelectric conversion film 107 by etching as illustrated in FIG. 13E, an interconnection to electrically connect the top surface of the connection electrode 103 and the counter electrode 108 is formed. At this time, if the lump 155 of copper oxide is present on the top surface of the connection electrode 153 as illustrated in FIG. 14, the lump 155 of copper oxide can hinder the connection between the connection electrode 153 and the interconnection, or increase the electrical resistance at the connection portion between the connection electrode 153 and the interconnection.

In contract, in the present embodiment, the connection electrode 103 contains at least one of tantalum nitride or an insulating film. Accordingly, in the connection electrode 103 of the present embodiment, a situation where copper from the plug 106 is diffused into the top surface of the connection electrode 103 is less likely to occur. Therefore, a situation where a lump of copper oxide is formed on the top surface of the connection electrode 103 is less likely to occur. Thus, a situation where the connection between the connection electrode 103 and the interconnection is hindered by a lump of copper oxide is less likely to be caused. In addition, a situation where electrical resistance at the connection portion between the connection electrode 103 and the interconnection is increased by a lump of copper oxide is less likely to be caused.

Figure 15:
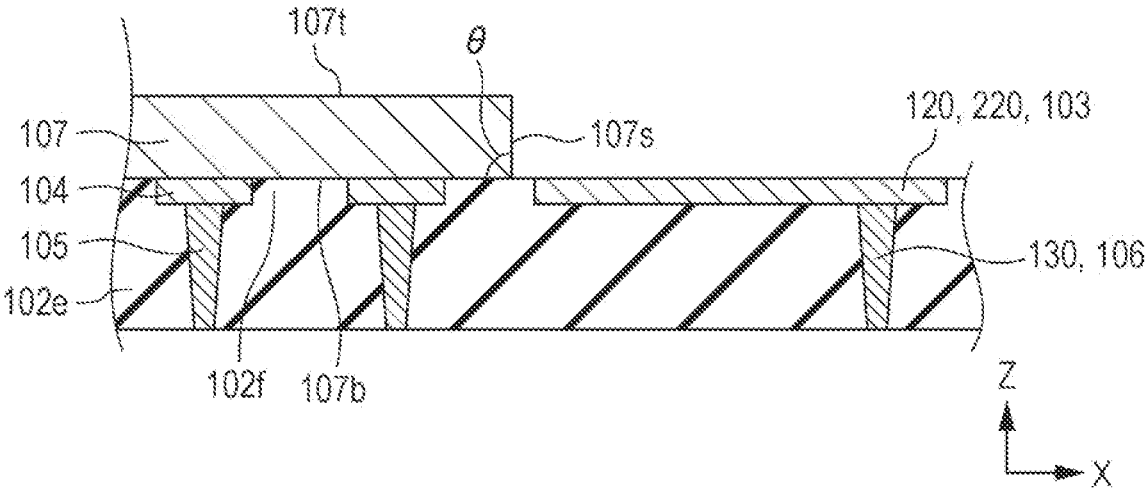
FIG. 15 is a schematic sectional view illustrating a photoelectric conversion film.

The shape of the photoelectric conversion film of the imaging device 1 of the present embodiment is described. FIG. 15 is a schematic sectional view illustrating the photoelectric conversion film. Note that FIG. 15 is a drawing for description, and illustration of some elements is omitted.

In the present embodiment, as illustrated in FIG. 15, the angle θ formed between a side surface 107s of the photoelectric conversion film 107 and a bottom surface 107b of the photoelectric conversion film 107 in a cross-section parallel to the top-bottom direction is greater than or equal to 70° and less than or equal to 90°. In this cross-section, at least part of the second electrode 120 or the second electrode 220 is located outside the photoelectric conversion film 107 in the lateral direction with respect to the side surface 107s. In the example illustrated in FIG. 15, typically after the photoelectric conversion film 107 having an angle θ of greater than or equal to 70° and less than or equal to 90° is fabricated, a counter electrode 108 and the like are formed in film shapes on the photoelectric conversion film 107. This way allows a better coverage of the films such as the counter electrode 108 formed on the photoelectric conversion film 107. This is advantageous from the viewpoint of enhancing the adhesion between adjacent films such as between the photoelectric conversion film 107 and the counter electrode 108, and improving application of the electric field to the photoelectric conversion film 107. Specifically, the angle θ may be greater than or equal to 80° and less than or equal to 90°. In the example of FIG. 15, specifically, in the above-described cross-section, the entirety of the second electrode 120 or the second electrode 220 is located outside the photoelectric conversion film 107 in the lateral direction with respect to the side surface 107s. However, in this above-described cross-section, only part of the second electrode 120 or the second electrode 220 may be located outside the photoelectric conversion film 107 in the lateral direction with respect to the side surface 107s.

The above-mentioned expression that at least part of the second electrode is located outside the photoelectric conversion film 107 in the lateral direction with respect to the side surface 107s of the photoelectric conversion film 107 is described. This expression means that in the lateral direction perpendicular to the top-bottom direction, at least part of the second electrode is located on the opposite side from the internal region of the photoelectric conversion film 107 as viewed from the side surface 107s. The side surface 107s of the photoelectric conversion film 107 is a surface connecting the top surface 107t and the bottom surface 107b of the photoelectric conversion film 107.

In the example of FIG. 15, specifically, the second electrode 120 or the second electrode 220 is the connection electrode 103. The plug 130 is the plug 106.

The method for forming the photoelectric conversion film 107 is not limited to the method using etching. For example, it is also possible to form the photoelectric conversion film 107 by forming films in a predetermined range by using a mask. In this case, in a typical example, the angle θ is less than 1°.

Fourth Embodiment

Figure 16:
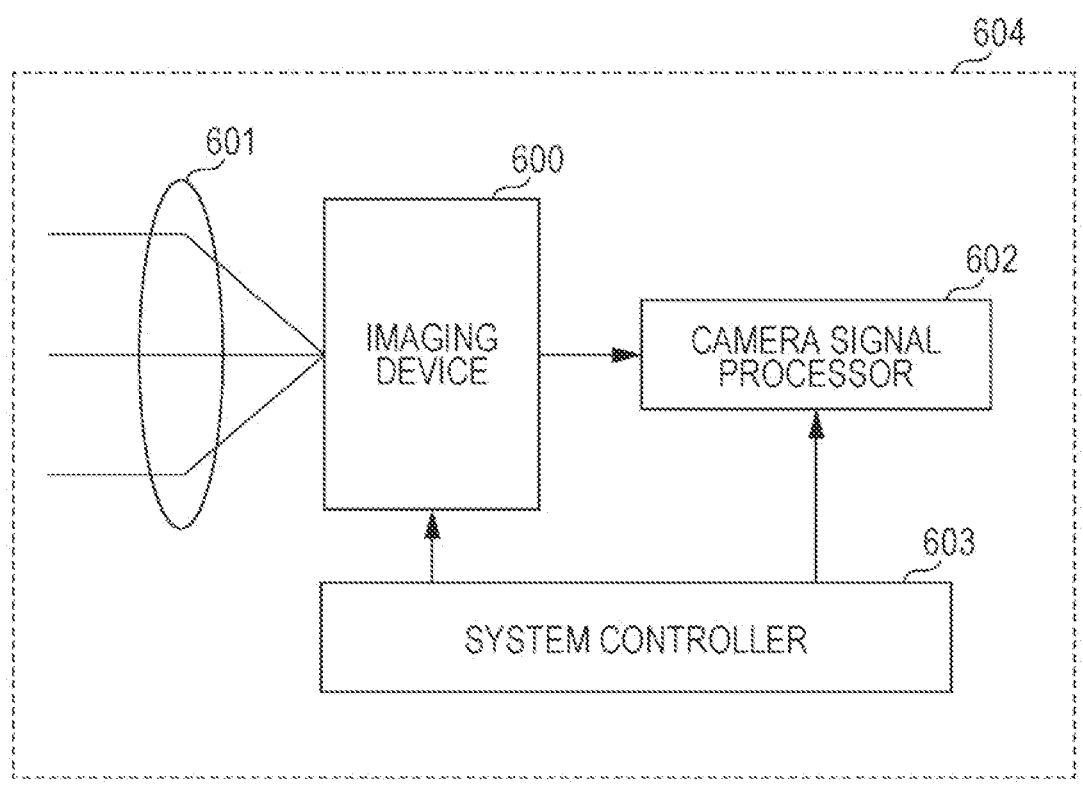
FIG. 16 is a schematic diagram of a camera system.

A camera system according to a fourth embodiment is described. FIG. 16 is a schematic diagram of the camera system.

The camera system 604 illustrated in FIG. 16 includes an imaging device 600, an optical system 601, a camera signal processor 602, and a system controller 603. As the imaging device 600, the imaging device 1 described in the first embodiment to the third embodiment can be employed. The optical system 601 concentrates light. The optical system 601 includes, for example, a lens. The camera signal processor 602 signal-processes image data captured by the imaging device 600, and outputs the signal-processed image data as an image or data. The system controller 603 controls the imaging device 600 and the camera signal processor 602.

The technique according to the present disclosure can be utilized in a digital still camera and the like.

What is claimed is:

1. An imaging device comprising:
   a photoelectric conversion film that converts light to charge; and
   an electrode that collects the charge, wherein:
   the electrode includes two or more conductive layers,
   the two or more conductive layers include a first layer containing tantalum nitride,
   an uppermost layer among the two or more conductive layers contains a metal nitride as a second layer different from the first layer, and
   the uppermost layer is always electrically connected to the first layer.

2. The imaging device according to claim 1, wherein the second layer contains titanium nitride.

3. The imaging device according to claim 1, wherein the first layer is thinner than the second layer.

4. The imaging device according to claim 1, wherein a lowermost layer among the two or more conductive layers contains tantalum.

5. The imaging device according to claim 1, wherein parts of outer peripheral ends of the two or more conductive layers coincide with each other.

6. The imaging device according to claim 1, wherein outer peripheral ends of the two or more conductive layers coincide with each other.

7. The imaging device according to claim 1, further comprising:
   a plug that has a connection surface connected to the electrode and that contains a metal.

8. An imaging device comprising:
   a photoelectric conversion film that converts light to charge; and
   an electrode that collects the charge, wherein:
   the electrode includes an electrode body and an insulating film,
   the electrode body includes a second layer forming at least part of a top surface of the electrode and a first layer forming at least part of a bottom surface of the electrode,
   the insulating film is formed on the first layer, and
   the first layer always electrically contacts the second layer.

9. The imaging device according to claim 8, wherein in a cross-section perpendicular to a thickness direction of the insulating film, the insulating film is surrounded by the electrode body.

10. The imaging device according to claim 8, further comprising:
   a plug that has a connection surface connected to the electrode and that contains a metal.

11. The imaging device according to claim 10, wherein;
   the first layer is disposed between the plug and the insulating film,
   the insulating film contains an oxide, and
   the first layer contains a non-oxide.

12. The imaging device according to claim 10, wherein when viewed from above, at least part of the insulating film and at least part of the connection surface in the plug overlap each other.

13. The imaging device according to claim 12, wherein when viewed from above, an entirety of the connection surface overlaps the insulating film.

14. The imaging device according to claim 10, wherein the plug contains copper.

15. The imaging device according to claim 8, wherein the second layer includes an entirety of the top surface of the electrode.

16. The imaging device according to claim 8, wherein the insulating film is located between the first layer and the second layer.

17. The imaging device according to claim 8, wherein a thickness of the insulating film is greater than or equal to 10 nm.

18. An imaging device, comprising:

a photoelectric conversion film that converts light to charge; and an electrode that collects the charge, wherein:

the electrode includes two or more layers, the two or more layers include a first layer containing tantalum nitride, an uppermost layer among the two or more layers contains a metal nitride, in a cross-section parallel to a thickness direction of the photoelectric conversion film, an angle formed between a side surface of the photoelectric conversion film and a bottom surface of the photoelectric conversion film is greater than or equal to 70° and less than or equal to 90°, and in the cross-section, at least part of the electrode is located outside the photoelectric conversion film in a lateral direction with respect to the side surface.

* * * * *